US011023175B2

(12) United States Patent
Kim

(10) Patent No.: US 11,023,175 B2
(45) Date of Patent: Jun. 1, 2021

(54) SEMICONDUCTOR MEMORY DEVICE INCLUDING PROGRAM OPERATION STATUS FLAG CELLS

(71) Applicant: SK hynix Inc., Icheon-si (KR)

(72) Inventor: Young Gyun Kim, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/578,770

(22) Filed: Sep. 23, 2019

(65) Prior Publication Data
US 2020/0233608 A1 Jul. 23, 2020

(30) Foreign Application Priority Data

Jan. 23, 2019 (KR) ........................ 10-2019-0008848

(51) Int. Cl.
| | |
|---|---|
| *G11C 16/10* | (2006.01) |
| *G11C 16/08* | (2006.01) |
| *G11C 16/34* | (2006.01) |
| *G11C 16/26* | (2006.01) |
| *G11C 29/42* | (2006.01) |
| *G11C 11/56* | (2006.01) |
| *G11C 16/04* | (2006.01) |
| *G06F 3/06* | (2006.01) |

(52) U.S. Cl.
CPC ............ *G06F 3/0659* (2013.01); *G06F 3/065* (2013.01); *G06F 3/0619* (2013.01); *G06F 3/0653* (2013.01); *G06F 3/0679* (2013.01); *G11C 16/08* (2013.01); *G11C 16/10* (2013.01); *G11C 16/26* (2013.01); *G11C 16/3459* (2013.01); *G11C 29/42* (2013.01); *G11C 11/5628* (2013.01); *G11C 11/5642* (2013.01); *G11C 16/0483* (2013.01)

(58) Field of Classification Search
None
See application file for complete search history.

(56) References Cited

U.S. PATENT DOCUMENTS

| | | | | |
|---|---|---|---|---|
| 8,773,905 | B1 * | 7/2014 | Radinski | ............. G11C 11/5642 365/185.03 |
| 10,192,628 | B1 * | 1/2019 | Hong | ................... G11C 11/5628 |
| 2007/0035997 | A1 * | 2/2007 | Shibata | .............. G11C 16/0483 365/185.03 |

(Continued)

FOREIGN PATENT DOCUMENTS

| | | |
|---|---|---|
| KR | 10-1495795 | 2/2015 |
| KR | 10-2016-0107606 | 9/2016 |

*Primary Examiner* — J. H. Hur
(74) *Attorney, Agent, or Firm* — Perkins Coie LLP

(57) ABSTRACT

A semiconductor memory device may include: a memory cell array including a plurality of memory cells; a peripheral circuit for performing a program operation on the memory cell array; and a control logic for controlling the peripheral circuit to perform the program operation on the memory cell array. The control logic may control the peripheral circuit to perform a program operation on memory cells included in a selected physical page among the plurality memory cells, in response to a program command, and control the peripheral circuit to perform an additional program operation on at least one memory cell among the memory cells included in the selected physical page, based on whether the program operation has passed.

17 Claims, 21 Drawing Sheets

(56) References Cited

U.S. PATENT DOCUMENTS

| | | | | |
|---|---|---|---|---|
| 2008/0084739 A1* | 4/2008 | Chae | ............... | G11C 16/3404 |
| | | | | 365/185.03 |
| 2008/0144380 A1* | 6/2008 | Youn | ............... | G11C 29/82 |
| | | | | 365/185.09 |
| 2012/0106247 A1* | 5/2012 | Shin | ............... | G11C 16/0483 |
| | | | | 365/185.03 |
| 2012/0147669 A1* | 6/2012 | Byeon | ............... | G11C 16/0483 |
| | | | | 365/185.03 |

* cited by examiner

SEMICONDUCTOR MEMORY DEVICE INCLUDING PROGRAM OPERATION STATUS FLAG CELLS

CROSS-REFERENCE TO RELATED APPLICATION

This patent document claims priority to the Korean patent application number 10-2019-0008848 filed on Jan. 23, 2019, which is incorporated herein by reference in its entirety for all purposes.

TECHNICAL FIELD

The disclosed technology generally relates to an electronic device, and more particularly, to a semiconductor memory device, a controller, and an operating method thereof.

BACKGROUND

Some semiconductor memory devices are integrated in a two-dimensional structure. As an example, two-dimensional NAND flash memory devices can be implemented as memory cell strings horizontally arranged on a semiconductor substrate. Some semiconductor memory devices can be integrated in a three-dimensional structure. As an example, three-dimensional NAND flash memory devices can be implemented as memory cell strings vertically arranged on a semiconductor substrate. Operations of such semiconductor memory devices are controlled by a memory controller or processor. The semiconductor memory device and the memory controller and/or processor may constitute a storage device.

SUMMARY

Embodiments of the disclosed technology, among other features and benefits, provide a semiconductor memory device having improved reliability, a controller, and an operating method thereof.

In an embodiment of the disclosed technology, a semiconductor memory device includes a memory cell array including a plurality of memory cells and one or more flag cells, each flag cell coupled to a unit of memory cells via a word line, and a controller in communication with the memory cell array. The controller is configured to select, from word lines coupled to the plurality of memory cells, a word line coupled to a set of target memory cells from the plurality of memory cells for programming, apply, to the selected word line, a series of programming pulses of increasing magnitude to raise threshold voltages of the set of target memory cells and program verification pulses to verify whether the threshold voltages of the set of target memory cells have been raised to above target threshold voltage levels, apply control voltages to the set of target memory cells to place the target memory cells in condition for application of the programming pulses, and upon determination of a status of program operations on the set of target memory cells, apply the control voltages to the one or more flag cells to place the one or more flag cells in condition for application of at least one of the programming pulses to program the one or more flag cells that indicate the status of program operations on the set of target memory cells.

In another embodiment of the disclosed technology, a semiconductor memory device includes a memory cell array including a plurality of memory cells to store data and one or more flag cells to indicate a status of program operations on the plurality of memory cells, and a controller in communication with the memory cell array. The controller is configured to determine whether the status of program operations on the plurality of memory cells is stored in the one or more flag cells associated with the plurality of memory cells, read the plurality of memory cells to determine whether data is successfully read by an error correction engine, and determine whether the program operations on the plurality of memory cells have been verified as completed and whether to designate the plurality of memory cells as failed memory cells based on the determination as to whether the status of program operations on the plurality of memory cells is stored in the one or more flag cells and the determination as to whether the data is successfully read by the error correction engine.

In an aspect of the disclosed technology, there is provided a semiconductor memory device including: a memory cell array including a plurality of memory cells; a peripheral circuit configured to perform a program operation on the memory cell array; and a control logic configured to control the peripheral circuit to perform the program operation on the memory cell array, wherein the control logic controls the peripheral circuit to perform a program operation on memory cells included in a selected physical page among the plurality memory cells, in response to a program command, and controls the peripheral circuit to perform an additional program operation on at least one memory cell among the memory cells included in the selected physical page, based on whether the program operation has passed.

In another aspect of the disclosed technology, there is provided a method for operating a controller for controlling a semiconductor memory device, the method including: sensing Sudden Power-Off (SPO) of the semiconductor memory device; transferring a read command for a physical page to be finally programmed to the semiconductor memory device, corresponding to the sensing of the SPO; receiving read data corresponding to the read command; and determining whether a final program operation has passed according to whether an additional program operation has been performed during the final program operation, based on the read data.

In another aspect of the disclosed technology, there is provided a controller for controlling a semiconductor memory device, the controller including: a Sudden Power-Off (SPO) sensor configured to generate an SPO sensing signal by sensing SPO of the semiconductor memory device; a program pass determiner configured to generate a control signal for reading a physical page to be finally programmed, in response to the SPO sensing signal; and a command generator configured to generate a read command for reading the physical page and transfer the read command to the semiconductor memory device, based on the control signal, wherein the program pass determiner determines whether a final program operation has passed, based on read data received corresponding to the read command.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration.

DETAILED DESCRIPTION

In this patent document, when an element is referred to as being "between" two elements, it can be the only element between the two elements, or one or more intervening elements may also be present. The technology disclosed in this patent document can be implemented in embodiments to provide a storage device including memory cell arrays that include flag memory cells to store a program status of the memory cell arrays.

Figure 1:
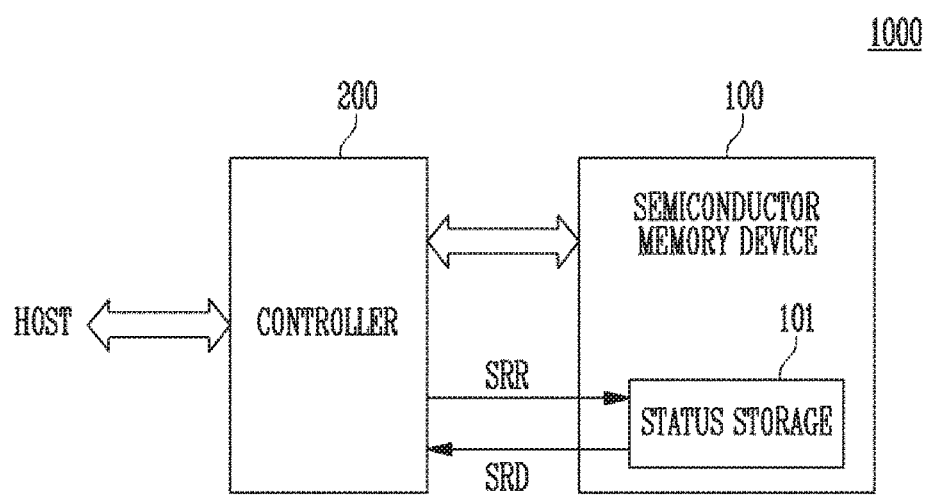
FIG. 1 is a block diagram illustrating an example of a storage device based on an embodiment of the disclosed technology.

FIG. 1 is a block diagram illustrating an example of a storage device based on an embodiment of the disclosed technology.

Referring to FIG. 1, the storage device 1000 includes a semiconductor memory device 100 and a controller 200. Also, the storage device 1000 is coupled to a host HOST as a user device.

The semiconductor memory device 100 is a device configured to operate under the control of the controller 200. The semiconductor memory device 100 may be provided as an integrated circuit in at least one chip, and perform a specific operation under the control of the controller 200. For example, the semiconductor memory device 100 may be provided as a nonvolatile memory device or volatile memory device. The semiconductor memory device 100 may be configured with a solid state disk, a Solid State Drive (SSD), a PC card (Personal Computer Memory Card International Association (PCMCIA)), a Compact Flash Card (CFC), a Smart Media Card (SMC), a memory stick, a Multi-Media Card (MMC, RS-MMC or MMCmicro), an SD Card (SD, miniSD, microSD or SDHC), a Universal Flash Storage (UFS), or the like.

The semiconductor memory device 100 may include a memory cell array (not shown) and a peripheral circuit (not shown). The memory cell array and the peripheral circuit, which are included in the semiconductor memory device 100, will be described later with reference to FIG. 2. Meanwhile, the semiconductor memory device 100 includes a status storage 101.

The memory cell array includes a plurality of memory cells. The peripheral circuit performs a program operation, a read operation, an erase operation, and the like on the memory cell array 110 in response to a command from the controller 200. In the program operation, the peripheral circuit may receive data from the controller 200, and store the received data in selected memory cells in the memory cell array. In the read operation, the peripheral circuit may read data stored in the selected memory cells in the memory cell array, and output the read data to the controller 200. In the erase operation, the peripheral circuit may erase data stored in the selected memory cells in the memory cell array. Although not shown in FIG. 1, the semiconductor memory device 100 further include a control logic configured to control the peripheral circuit to perform the data program operation, the data read operation, and the data erase operation on the memory cell array. The status storage 101 receives a status read request SRR from the controller 200, and transfers status read data SRD to the controller 200 in response to the status read request SRR. More specifically, the status storage 101 may store the status read data SRD representing whether the semiconductor memory device 100 corresponds to a ready state or a busy state. The status read data SRD may be output in response to the status read request SRR received from the controller 200.

That the semiconductor memory device 100 corresponds to the ready state may mean that the semiconductor memory device 100 has completed an internal operation and is waiting. For example, that the semiconductor memory device 100 corresponds to the ready state may mean that the semiconductor memory device 100 has completed a program operation, a read operation, or an erase operation, which corresponds to a command.

That the semiconductor memory device 100 corresponds to the busy state may mean that the semiconductor memory device 100 is still performing an internal operation. For example, that the semiconductor memory device 100 corresponds to the busy state may mean that the semiconductor memory device 100 is still performing a program operation, a read operation, or an erase operation, which corresponds to a command.

The controller 200 is coupled between the host HOST and the semiconductor memory device 100. The controller 200 may transfer a command to the semiconductor memory device 100 in response to a request from the host HOST. The semiconductor memory device 100 may perform an operation corresponding to the received command. The host HOST may be configured with a device such as a personal or portable computer, a Personal Digital Assistant (PDA), a Portable Media Player (PMP), or an MP3 player. The host HOST and the storage device 1000 may be coupled to each other by a standardized interface such as a USB, an SCSI, an ESDI, SATA, SAS, PCI-express, or an IDE interface.

In an embodiment, the controller 200 may control the semiconductor memory device 100 to perform a program operation, a read operation, or an erase operation in response to a request from the host HOST. In the program operation, the controller 200 may provide the semiconductor memory device 100 a command corresponding to the program operation (hereinafter, referred to as a program command), an address, and data. The semiconductor memory device 100 may program the data in memory cells indicated by the address. In the read operation, the controller 200 may provide the semiconductor memory device 100 with a command corresponding to the read operation (hereinafter, referred to as a read command) and an address. The semiconductor memory device 100 may read data from memory cells indicated by the address and output the read data to the controller 200. In the erase operation, the controller 200 may provide the semiconductor memory device 100 with a command corresponding to the erase operation (hereinafter, referred to as an erase command) and an address. The semiconductor memory device 100 may erase data stored in memory cells indicated by the address.

The controller 200 transfers a command to the semiconductor memory device 100, and then checks whether performance of an operation corresponding to the corresponding command has completed. Also, the controller 200 may check whether the performance of the operation corresponding to the corresponding command has succeeded or failed. In order to check whether the performance of the operation corresponding to the corresponding command has succeeded or failed, the controller 200 may transfer a program command, a read command, or an erase command, and then perform a status read on the semiconductor memory device 100. When the controller 200 transfers a status read request SRR to the semiconductor memory device 100, the semiconductor memory device 100 may provide status read data SRD to the controller 200. The semiconductor memory device 100 may transfer, to the controller 200, whether the operation corresponding to the command has been completed, whether the operation corresponding to the command is being performed, or whether the operation corresponding to the command has failed, through the status read data SRD. More specifically, the status read request SRR received from the controller 200 is transferred to the status storage 101 of the semiconductor memory device 100. The semiconductor memory device 100 transfers the status read data SRD stored in the status storage 101 to the controller 200, corresponding to the status read request SRR.

Therefore, the controller 200 may determine whether the operation of the semiconductor memory device has succeeded according to the status read data SRD stored in the status storage 101 of the semiconductor memory device 100. For example, when the semiconductor memory device 100 performs a program operation, data representing whether the program operation has succeeded may be stored as the status read data SRD in the status storage 101 after the program operation is completed. The controller 200 may determine whether the program operation of the semiconductor memory device 100 has been successfully performed, based on the status read data SRD provided from the semiconductor memory device 100. In an example, when the program operation of the semiconductor memory device 100 fails, the semiconductor memory device 100 stores status read data SRD representing program fail in the status storage 101. The controller 200 may transfer a status read request SRR to the semiconductor memory device 100. The status read data SRD representing the program fail is transferred to the controller 200 in response to the status read request SRR. The controller 200 may perform a subsequent operation, based on the status read data SRD representing the program fail. For example, a program command for allowing corresponding program data to be stored in another region of the semiconductor memory device 100 may be re-transmitted to the semiconductor memory device 100. The semiconductor memory device 100 may re-perform a program operation on the corresponding program data.

However, there may occur a problem when the supply of power to the storage device 1000 is interrupted before the controller 200 recognizes that the program operation of the semiconductor memory device 100 has failed or when the supply of power to the storage device 1000 is interrupted before a subsequent operation is performed after the controller 200 recognizes that the program operation of the semiconductor memory device 100 has failed. The status read data SRD stored in the status storage 101 of the semiconductor memory device 100 is lost. When power is re-supplied to the storage device 1000 under the above-described situation, the controller 200 cannot determine the status of a previous program operation—whether a set of target memory cells have been verified as properly programmed ("program pass") or not ("program fail"). In an implementation where a program operation is performed on a page basis, the set of target memory cells can indicate one or more pages. Here, the "target memory cells" can indicate memory cells that are targeted to be programmed by the current program operation.

The semiconductor memory device 100 implemented based on an embodiment of the disclosed technology stores, in a flag memory cell, data representing whether target memory cells have been verified as properly programmed in the program operation. Accordingly, the semiconductor memory device can determine whether target memory cells have been verified as properly programmed in a previous program operation even in a situation where a memory controller fails to store the status of the previous program operation in its own memory due to a sudden loss of power.

Figure 2:
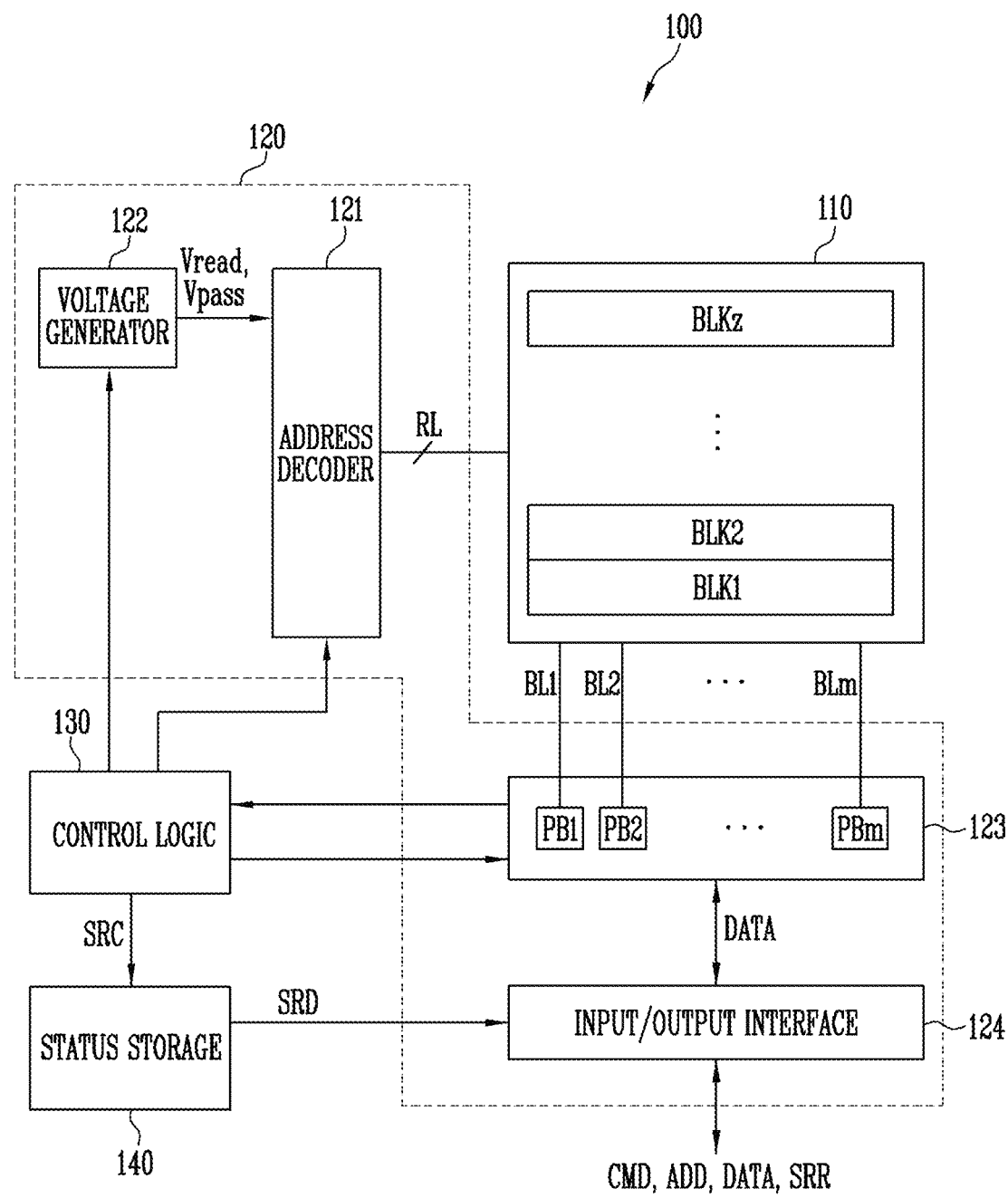
FIG. 2 is a block diagram illustrating an example of a semiconductor memory device shown in FIG. 1.

FIG. 2 is a block diagram illustrating an example of the semiconductor memory device shown in FIG. 1.

Referring to FIG. 2, the semiconductor memory device 100 may include a memory cell array 110 configured to store data, a peripheral circuit 120 configured to perform an erase operation, a program operation, a read operation, and the like on the memory cell array 110, and a control logic 130 configured to control the peripheral circuit 120. The semiconductor memory device 100 implemented based on an embodiment of the disclosed technology may further include a status storage 140. The status storage 140 stores an operating status of the memory cell array 110 as status read data SRD. The status storage 140 shown in FIG. 2 may be a component identical to the status storage 101 shown in FIG. 1. The status read data SRD may be transferred to the controller 200 through an input/output interface 124.

The memory cell array 110 includes a plurality of memory blocks (not shown), and the memory blocks include a plurality of cell strings (not shown). For example, the cell strings include drain select transistors, memory cells, and source select transistors, and are coupled to bit lines BL. Gates of the drain select transistors are coupled to drain select lines DSL, gates of the memory cells are coupled to word lines WL, and gates of the source select transistors are coupled to source select lines.

The peripheral circuit 120 includes a voltage generator 122, an address decoder 121, a read/write circuit 123, and the input/output interface 124. The voltage generator 122 generates operating voltages necessary for various operations under the control of the control logic 130. For example, the voltage generator 122 may generate a read voltage Vread and a pass voltage Vpass, which are required in a data read operation. Also, the voltage generator 122 generates, as operating voltages, a program voltage including a plurality of program pulses, a program pass voltage, a verify voltage, an erase voltage, and the like.

The address decoder 121 transfers operating voltages to drain select lines DSL, word lines WL, and source select lines SSL, which are coupled to a selected memory block among the plurality of memory blocks included in the memory cell array 110, in response to an address received from the control logic 130.

The read/write circuit 123 exchanges data with the memory cell array 110 in response to a column address CADD. Also, the read/write circuit 123 includes a plurality of page buffers PB1 to PBm respectively coupled to bit lines BL1 to BLm of the memory cell array 110.

The input/output interface 124 receives a command CMD, data, and an address ADD from the outside. Also, the input/output interface 124 receives a status read request SRR. In a status check operation, the input/output interface 124 receives status read data SRD from the status storage 140 and outputs the status read data SRD to the outside.

The control logic 130 may control overall operations of the semiconductor memory device 100 in response to the received command CMD and the received address ADD. Meanwhile, when the status read request SRR is received from the outside, the control logic 130 outputs a status read control signal SRC to the status storage 140. The status storage 140 may store an operating status of the memory cell array 110 as the status read data SRD. Meanwhile, the status storage 140 outputs the status read data SRD to the input/output interface 124, based on the status read control signal SRC received from the control logic 130.

Figure 3:
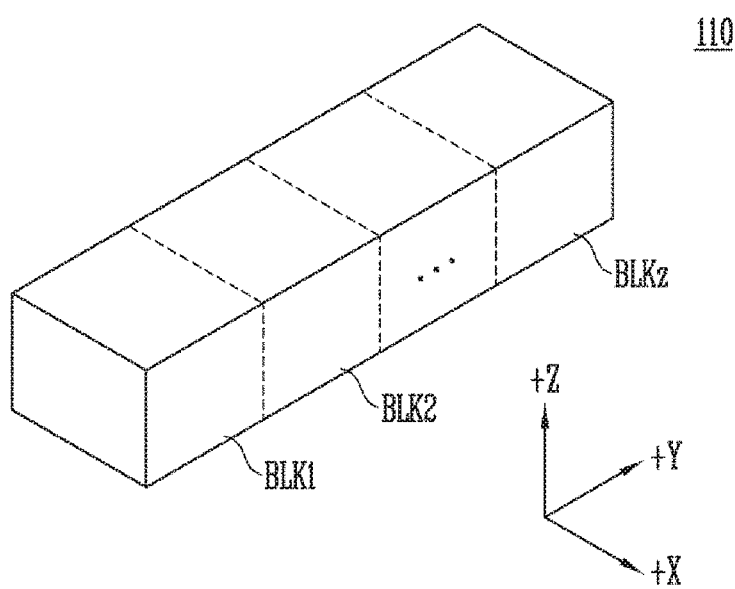
FIG. 3 is a diagram illustrating an example of a memory cell array shown in FIG. 2.

FIG. 3 is a diagram illustrating an example of a memory cell array shown in FIG. 2.

Referring to FIG. 3, the memory cell array 110 may include a plurality of memory blocks BLK1 to BLKz. Each memory block may have a three-dimensional structure. Each memory block may include a plurality of memory cells stacked on a substrate (not shown). The plurality of memory cells may be arranged along +X, +Y, and +Z directions. A structure of each memory block will be described in more detail with reference to FIGS. 4 to 6.

Figure 4:
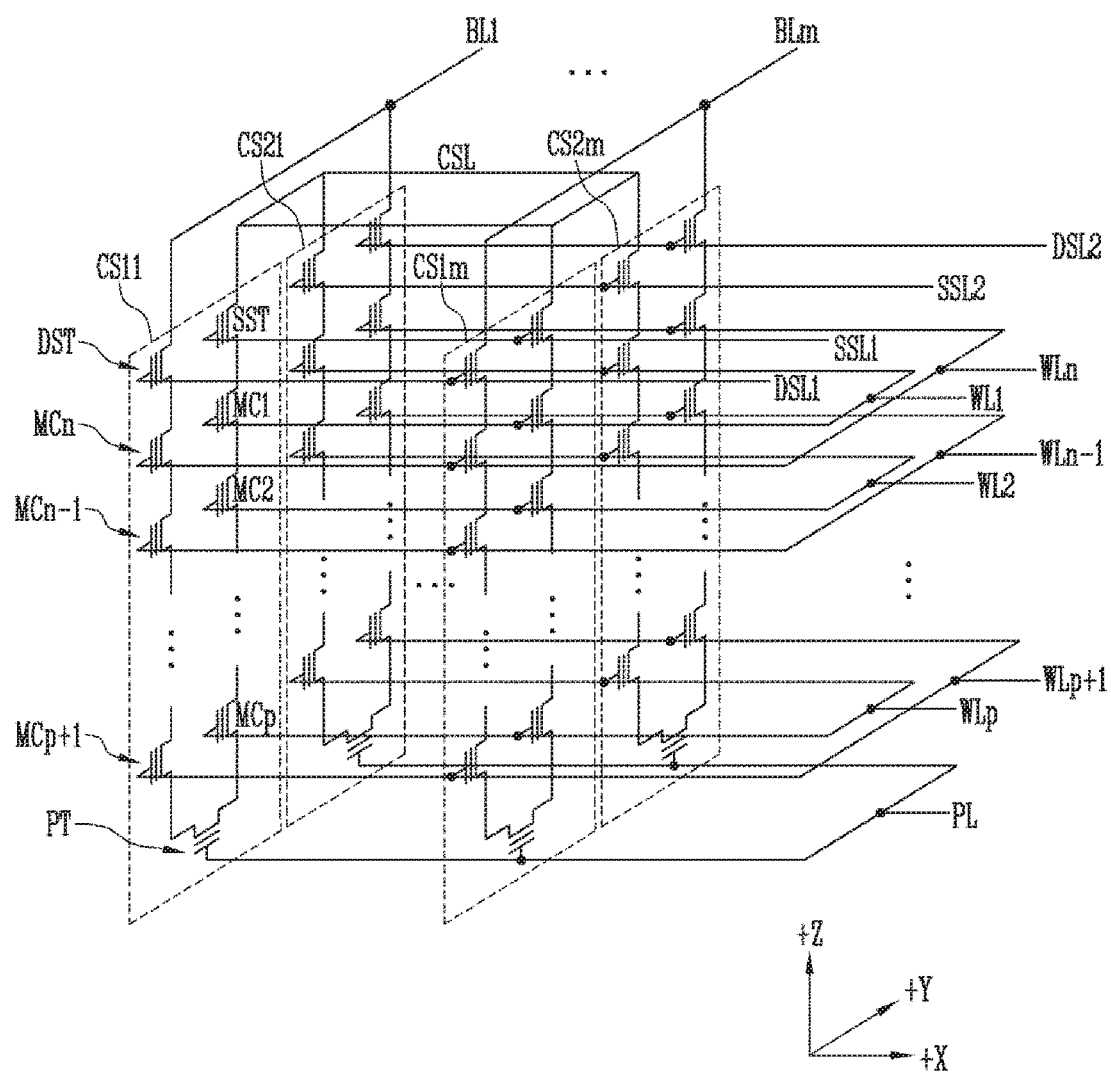
FIG. 4 is a circuit diagram illustrating an example memory block among memory blocks shown in FIG. 3.

FIG. 4 is a circuit diagram illustrating an example memory block BLKa among the memory blocks BLK1 to BLKz shown in FIG. 3.

Referring to FIG. 4, the memory block BLKa may include a plurality of cell strings CS11 to CS1$m$ and CS21 to CS2$m$. In an embodiment, each of the plurality of cell strings CS11 to CS1$m$ and CS21 to CS2$m$ may be formed in a 'U' shape. In the memory block BLKa, m cell strings are arranged in a row direction (i.e., a +X direction). FIG. 4 illustrates two cell strings arranged in a column direction (i.e., a +Y direction). However, this is for convenience of description, and it will be understood that three cell strings may be arranged in the column direction.

Each of the plurality of cell strings CS11 to CS1$m$ and CS21 to CS2$m$ may include at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and memory cells MC1 to MCp.

In an embodiment, the source select transistors of cell strings arranged on the same row are coupled to a source select line extending in the row direction, and the source select transistors of cell strings arranged on different rows are coupled to different source select lines. In FIG. 4, the source select transistors of the cell strings CS11 to CS1$m$ on a first row are coupled to a first source select line SSL1. The source select transistors of the cell strings CS21 to CS2$m$ on a second row are coupled to a second source select line SSL2.

In another embodiment, the source select transistors of the cell strings CS11 to CS1$m$ and CS21 to CS2$m$ may be commonly coupled to one source select line.

The first to nth memory cells MC1 to MCn of each cell string are coupled between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction, and are coupled in series between the source select transistor SST and the pipe transistor PT. The (p+1)th to nth memory cells MCp+1 to MCn are sequentially arranged in the +Z direction, and are coupled in series between the pipe transistor PT and the drain select transistor DST. The first to pth memory cells MC1 to MCp and the (p+1)th to nth memory cells MCp+1 to MCn are coupled through the pipe transistor PT. Gate electrodes of the first to nth memory cells MC1 to MCn of each cell string are coupled to first to nth word lines WL1 to WLn, respectively.

A gate of the pipe transistor PT of each cell string is coupled to a pipe line PL.

The drain select transistor DST of each cell string is coupled between a corresponding bit line and the memory cells MCp+1 to MCn. Cell strings arranged in the row direction are coupled to a drain select line extending in the row direction. The drain select transistors of the cell strings CS11 to CS1$m$ on the first row are coupled to a first drain select line DSL1. The drain select transistors of the cell strings CS21 to CS2$m$ on the second row are coupled to a second drain select line DSL2.

Cell strings arranged in the column direction are coupled to a bit line extending in the column direction. In FIG. 4, the cell strings CS11 and CS21 on a first column are coupled to a first bit line BL1. The cell strings CS1$m$ and CS2$m$ on an mth column are coupled to an mth bit line BLm.

Memory cells coupled to the same word line in the cell strings arranged in the row direction constitute one page. For example, memory cells coupled to the first word line WL1 in the cell strings CS11 to CS1$m$ on the first row constitute one page. Memory cells coupled to the first word line WL1 in the cell strings CS21 to CS2$m$ on the second row constitute another page. As any one of the drain select lines DSL1 and DSL2 is selected, cell strings arranged in one row direction may be selected. As any one of the word lines WL1 to WLn is selected, one page may be selected in the selected cell strings.

In another embodiment, even bit lines and odd bit lines may be provided instead of the first to mth bit lines BL1 to BLm. In addition, even-numbered cell strings among the cell strings CS11 to CS1$m$ or CS21 to CS2$m$ arranged in the row direction may be coupled to the even bit lines, respectively, and odd-numbered cell strings among the cell strings CS11 to CS1$m$ or CS21 to CS2$m$ arranged in the row direction may be coupled to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKa is improved. On the other hand, the size of the memory block BLKa increases. When the number of dummy memory cells decreases, the size of the memory block BLKa decreases. On the other hand, the reliability of an operation of the memory block BLKa may be deteriorated.

In order to efficiently control the at least one dummy memory cell, the dummy memory cells may have a required threshold voltage. Before or after an erase operation of the memory block BLKa, a program operation may be performed on all or some of the dummy memory cells. When an erase operation is performed after the program operation is performed, a voltage applied to the dummy word lines coupled to the respective dummy memory cells is controlled, so that the dummy memory cells can have the required threshold voltage.

Figure 5:
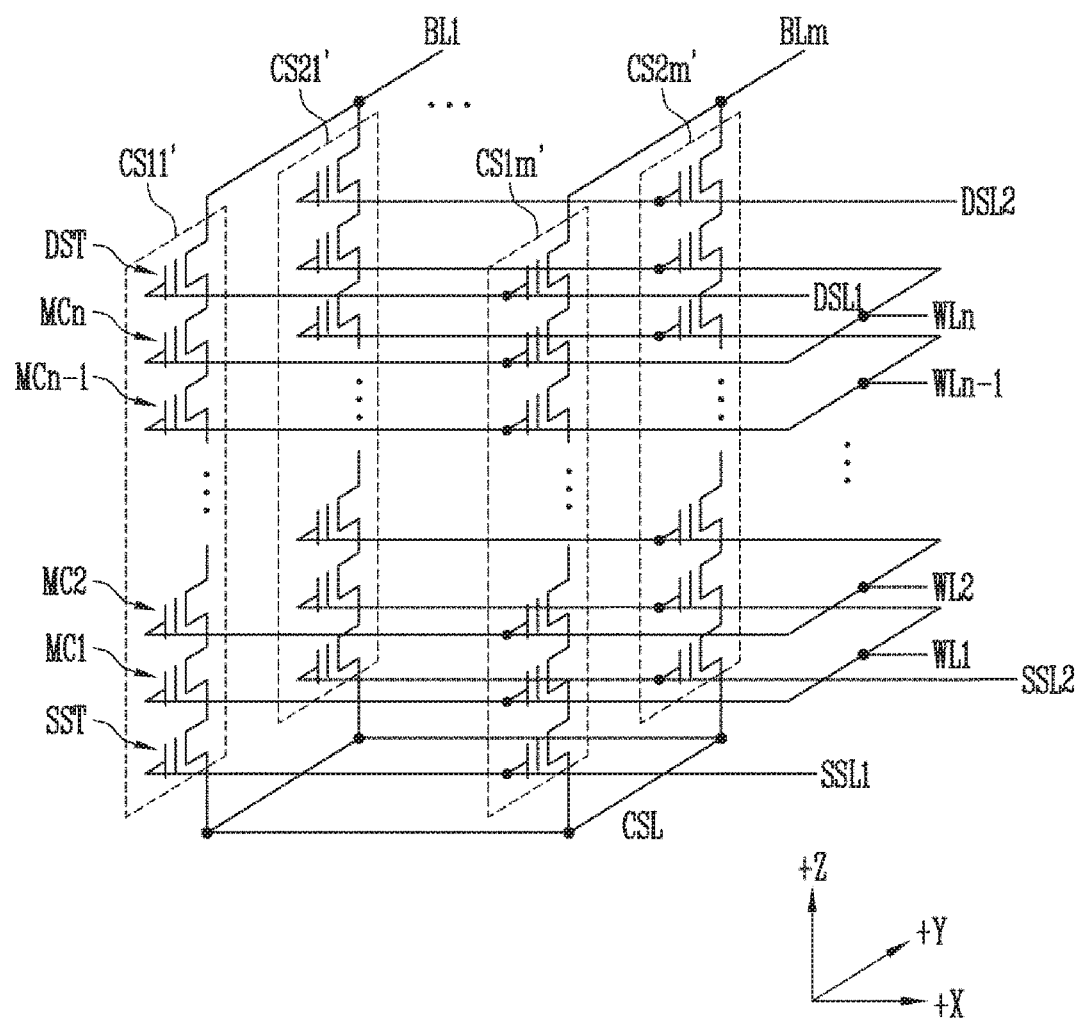
FIG. 5 is a circuit diagram illustrating another example of the memory block among the memory blocks shown in FIG. 3.

FIG. 5 is a circuit diagram illustrating another example BLKb of the memory block among the memory blocks BLK1 to BLKz shown in FIG. 3.

Referring to FIG. 5, the memory block BLKb may include a plurality of cell strings CS11' to CS1$m$' and CS21' to CS2$m$'. Each of the plurality of cell strings CS11' to CS1$m$' and CS21' to CS2$m$' extends along the +Z direction. Each of the plurality of cell strings CS11' to CS1$m$' and CS21' to CS2$m$' includes at least one source select transistor SST, first to nth memory cells MC1 to MCn, and at least one drain select transistor DST, which are stacked on a substrate (not shown) under the memory block BLKb.

The source select transistor SST of each cell string is coupled between a common source line CSL and the memory cells MC1 to MCn. The source select transistors of cell strings arranged on the same row are coupled to the same source select line. The source select transistors of the cell strings CS11' to CS1$m$' arranged on a first row are coupled to a first source select line SSL1. Source select transistors of the cell strings CS21' to CS2$m$' arranged on a second row are coupled to a second source select line SSL2. In another embodiment, the source select transistors of the cell strings CS11' to CS1$m$' and CS21' to CS2$m$' may be commonly coupled to one source select line.

The first to nth memory cells MC1 to MCn of each cell string are coupled in series between the source select transistor SST and the drain select transistor DST. Gate electrodes of the first to nth memory cells MC1 to MCn are coupled to first to nth word lines WL1 to WLn, respectively.

The drain select transistor DST of each cell string is coupled between a corresponding bit line and the memory cells MC1 to MCn. The drain select transistors of cell strings arranged in the row direction are coupled to a drain select line extending in the row direction. The drain select transistors of the cell strings CS11' to CS1$m$' on the first row are coupled to a first drain select line DSL1. The drain select transistors of the cell strings CS21' to CS2$m$' on the second row are coupled to a second drain select line DSL2.

Consequently, the memory block BLKb of FIG. 5 has a circuit similar to that of the memory block BLKa of FIG. 4, except that the pipe transistor PT is excluded from each cell string in FIG. 5.

In another embodiment, even bit lines and odd bit lines may be provided instead of the first to mth bit lines BL1 to BLm. In addition, even-numbered cell strings among the cell strings CS11' to CS1m' or CS21' to CS2m' arranged in the row direction may be coupled to the even bit lines, respectively, and odd-numbered cell strings among the cell strings CS11' to CS1m' or CS21' to CS2m' arranged in the row direction may be coupled to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCn. Alternatively, the at least one dummy memory cell may be provided to decrease an electric field between the drain select transistor DST and the memory cells MC1 to MCn. When the number of dummy memory cells increases, the reliability of an operation of the memory block BLKb is improved. On the other hand, the size of the memory block BLKb is increased. When the number of dummy memory cells decreases, the size of the memory block BLKb decreases. On the other hand, the reliability of an operation of the memory block BLKb may be deteriorated.

In order to efficiently control the at least one dummy memory cell, the dummy memory cells may have a required threshold voltage. Before or after an erase operation of the memory block BLKb, a program operation may be performed on all or some of the dummy memory cells. When an erase operation is performed after the program operation is performed, a voltage applied to the dummy word lines coupled to the respective dummy memory cells is controlled, so that the dummy memory cells can have the required threshold voltage.

Figure 6:
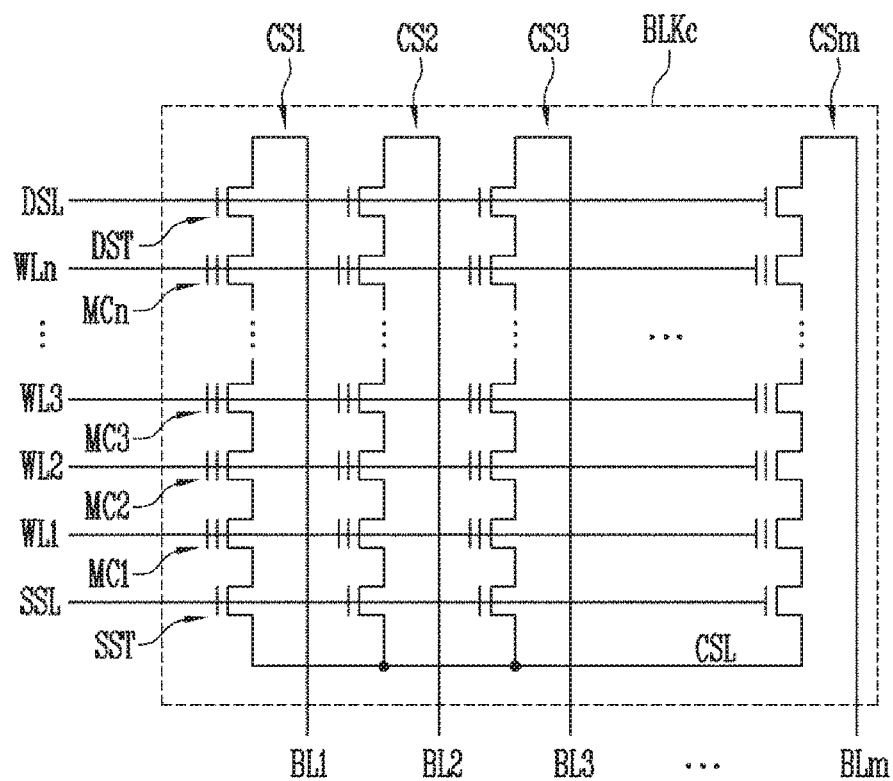
FIG. 6 is a circuit diagram illustrating an example memory block among a plurality of memory blocks included in the memory cell array shown in FIG. 2.

FIG. 6 is a circuit diagram illustrating an example of the memory block BLKc among the plurality of memory blocks BLK1 to BLKz included in the memory cell array 110 shown in FIG. 2.

Referring to FIG. 6, the memory block BLKc includes a plurality of strings CS1 to CSm. The plurality of strings CS1 to CSm may be coupled to a plurality of bit lines BL1 to BLm, respectively. Each of the plurality of strings CS1 to CSm includes at least one source select transistor SST, first to nth memory cells MC1 to MCn, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and the memory cells MC1 to MCn.

The first to nth memory cells MC1 to MCn of each cell string is coupled between the source select transistor SST and the drain select transistor DST.

The drain select transistor DST of each cell string is coupled between a corresponding bit line and the memory cells MC1 to MCn.

Memory cells coupled to the same word line constitute one page. As a drain select line DSL is selected, the cell strings CS1 to CSm may be selected. As any one of word lines WL1 to WLn is selected, one page among selected cell strings may be selected.

In another embodiment, even bit lines and odd bit lines may be provided instead of the first to mth bit lines BL1 to BLm. Even-numbered cell strings among the cell strings CS1 to CSm may be coupled to the even bit lines, respectively, and odd-numbered cell strings among the cell strings CS1 to CSm may be coupled to the odd bit lines, respectively.

Figure 7:
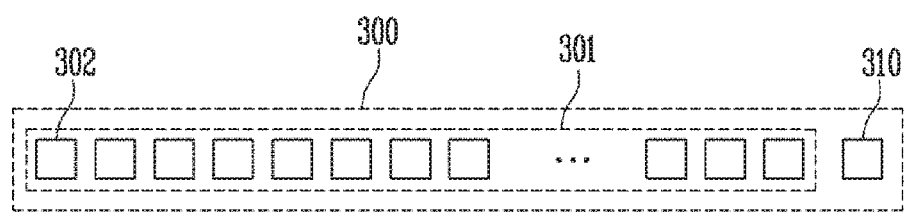
FIG. 7 is a diagram illustrating a physical page including a flag memory cell based on an embodiment of the disclosed technology.

FIG. 7 is a diagram illustrating a physical page including a flag memory cell based on an embodiment of the disclosed technology.

Referring to FIG. 7, a physical page 300 included in a memory block is illustrated. The physical page may be a set of memory cells coupled to the same word line, to become a unit of a read operation or a program operation. The physical page 300 based on an embodiment of the disclosed technology may include a normal memory cell group 301 and a flag memory cell 310. The normal memory cell group 301 may include a plurality of normal memory cells 302. Normal data may be stored in the normal memory cell group 301. Data representing whether a program operation on the normal memory cell group 301 of the physical page 300 has normally completed may be stored in the flag memory cell 310.

An embodiment in which the physical page 300 includes one flag memory cell 310 is illustrated in FIG. 7. However, in some embodiments, the physical pages 300 may include two or more flag memory cells.

Figure 8:
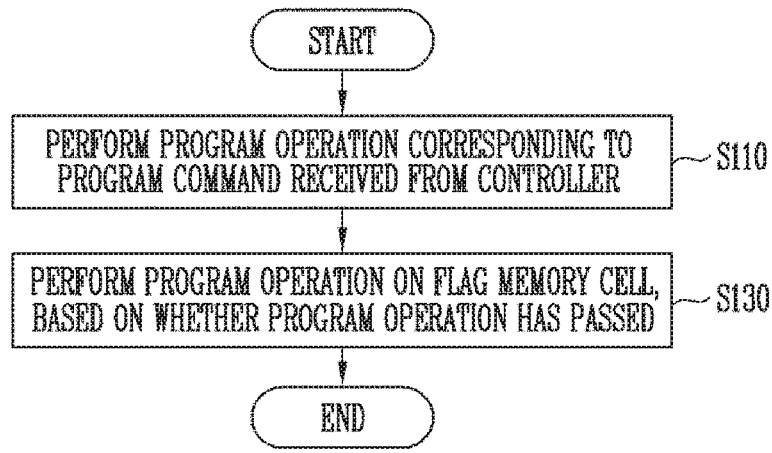
FIG. 8 is a flowchart illustrating an example of an operating method of the semiconductor memory device based on an embodiment of the disclosed technology.

FIG. 8 is a flowchart illustrating an example of an operating method of the semiconductor memory device based on an embodiment of the disclosed technology.

Referring to FIG. 8, the operating method of the semiconductor memory device implemented based on an embodiment of the disclosed technology includes step S110 of performing a program operation corresponding to a program command received from the controller and step S130 of performing a program operation on a flag memory cell, based on whether target memory cells have been verified as properly programmed.

In the step S110, an operation of programming data in memory cells included in a normal memory cell group 301 of a selected physical page 300 to be programmed may be performed. The program operation may include a program voltage applying operation of applying a program voltage to a selected word line coupled to a selected page and a verify operation of determining whether threshold voltages of memory cells coupled to the selected word line have reached a target level. The program voltage applying operation and the verify operation may constitute one loop, and a plurality of loops may be repeated during the program operation. The program operation of the step S110 may be performed using an Incremental Step Pulse Program (ISPP) scheme in which a program voltage is gradually increased whenever loops are performed.

In the step S130, a program operation on a flag memory cell 310 of the selected physical page 300 may be performed based on whether the program operation performed in the step S110 has passed. Data representing whether target memory cells have been verified as properly programmed ("program pass") in the corresponding program operation may be stored in the flag memory cell 310.

In an embodiment, when the status of the program operation is "program pass," the flag memory cell 310 may be programmed to represent that target memory cells in the normal memory cell group 301 of the physical page 300 have been verified as properly programmed. In a scenario when the storage device 1000 is powered on after a sudden power-off (SPO), it may be determined whether target memory cells have been verified as properly programmed in a program operation before the SPO by referring to a program state of the flag memory cell 310. That is, when the storage device 1000 is turned on after the SPO, the controller 200 reads a data bit stored in the flag memory cell 310 of the physical page 300. In an implementation, when the data bit stored in the flag memory cell 310 is 1, it may be determined that the program operation on the target memory cells included in the normal memory cell group 301 of the physical page 300 before the SPO was not normally completed. When the data bit stored in the flag memory cell 310 is 0, it may be determined that the program operation on the target memory cells included in the normal memory cell group 301 of the physical page 300 was normally completed before the SPO occurred. The above-described embodiment will be described later with reference to FIGS. 9 to 13B.

In another embodiment, when the program operation finally fails, the flag memory cell 310 may be programmed so as to represent that the program operation on the target memory cells included in the normal memory cell group 301 of the physical page 300 has failed. In a scenario when the storage device 1000 is powered on after Sudden Power-Off (SPO) of the storage device 1000, it may be determined whether a program operation before the SPO has failed according to a program state of the flag memory cell 310. That is, when the storage device 1000 is turned on after the SPO, the controller 200 reads a bit stored in the flag memory cell 310 of the physical page 300. When the data bit stored in the flag memory cell 310 is 1, it may be determined that before the SPO the program operation on the target memory cells included in the normal memory cell group 301 of the physical page 300 was being performed or target memory cells were properly programmed. When the data bit stored in the flag memory cell 310 is 0, it may be determined that the program operation on the target memory cells included in the normal memory cell group 301 of the physical page 300 were verified as failed before the SPO occurred. The above-described embodiment will be described later with reference to FIGS. 14 to 17.

Figure 9:
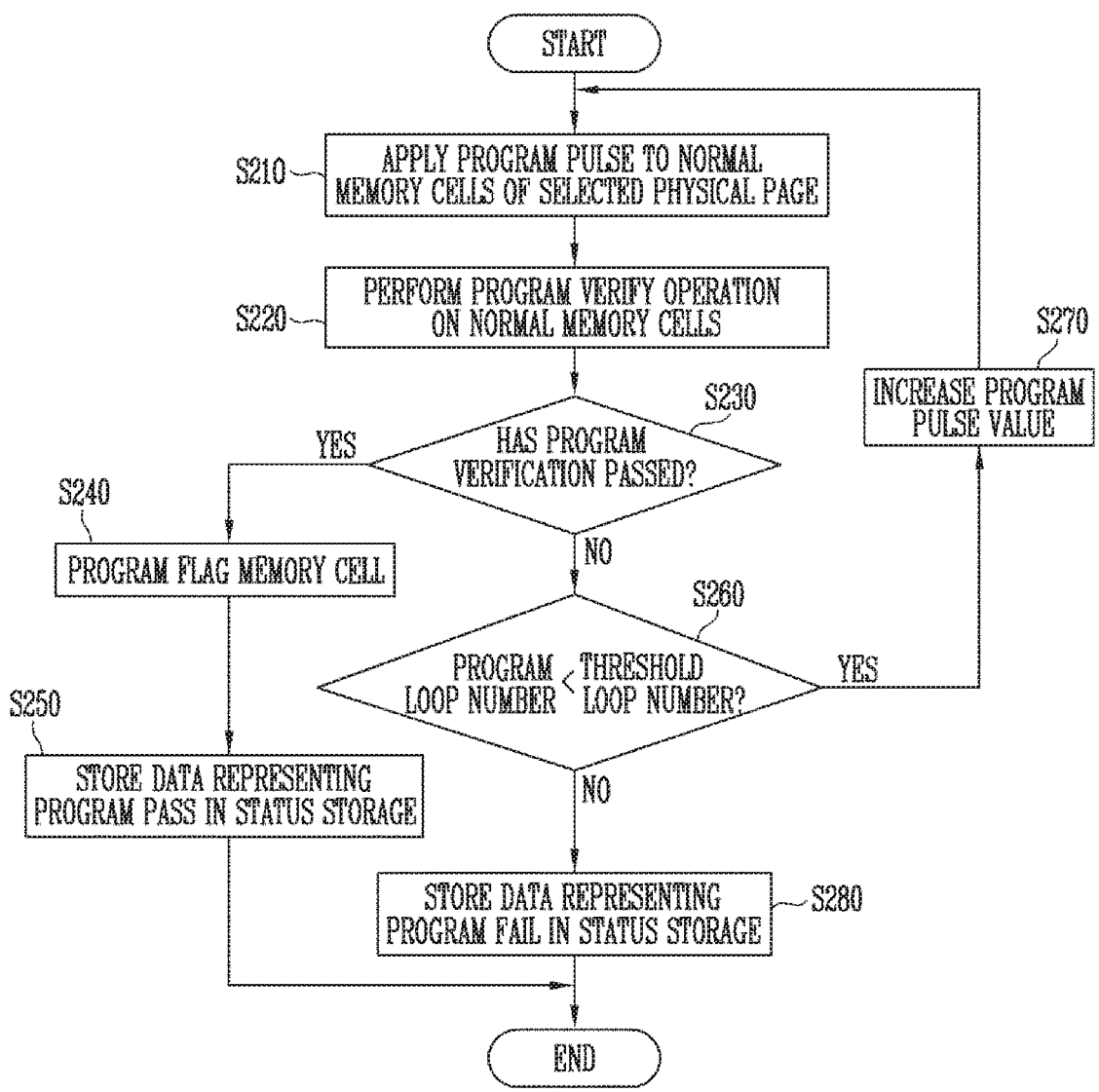
FIG. 9 is a flowchart illustrating an example of the operating method of the semiconductor memory device based on an embodiment of the disclosed technology.

FIG. 9 is a flowchart illustrating an example of the operating method of the semiconductor memory device based on an embodiment of the disclosed technology.

Referring to FIG. 9, a program operation according to the operating method of the semiconductor memory device implemented based on an embodiment of the disclosed technology is performed. First, a program pulse is applied to normal memory cells 302 included in the normal memory cell group 301 of the selected physical page 300 (S210). Accordingly, threshold voltages of the memory cells to which the program pulse is applied are increased. In the step S210, the flag memory cell 310 is not programmed. More specifically, in the step S210, a program inhibit voltage is applied to a bit line coupled to the flag memory cell 310. Accordingly, although the program pulse is applied to a word line commonly coupled to the flag memory cell 310 and the normal memory cells 302, a threshold voltage of the flag memory cell 310 is not increased.

Subsequently, a program verify operation on the normal memory cells is performed (S220). Subsequently, in step S230, it is determined whether target memory cells have been verified as properly programmed ("program pass"). When there is no "program pass" flag, it is determined whether a current program loop number is smaller than a threshold (e.g., maximum) loop number (S260). Under a program-and-verify approach using the incremental step pulse programming (ISPP) scheme, program and program verification steps are repeated for a predetermined number of iterations ("maximum loop number") or until all target memory cells have been verified as properly programmed within a predetermined number of iterations ("maximum loop number"). For example, when a maximum of thirty (30) program/verify loops are performed, the maximum program loop is the thirtieth program loop, and the threshold loop number may be 30. When the current program loop number is smaller than the threshold loop number, the magnitude of the program pulse is increased by a step voltage to increase threshold voltages of memory cells that have not been properly programmed yet (S270), and a subsequent program loop is performed by proceeding to the step S210.

The steps S210, S220, S230, S260, and S270 may constitute a program loop using the above-described ISPP scheme. The steps S210, S220, S230, S260, and S270, i.e., the program loop, are repeated within a predetermined threshold loop number, so that a program operation on the normal memory cells in the selected physical page 300 is performed.

When the program loop number reaches the threshold loop number as the determination result of the step S260, data representing program fail is stored in the status storage 101 or 140 (S280), and the program operation is ended. Therefore, a final program operation fails.

In an implementation, the flag memory cell is coupled to the word line to which the target memory cells are coupled. When the target memory cells 302 have been verified as properly programmed in the program/verification as a determination result of the step S230, the flag memory cell 310 in the physical page 300 is programmed (S240). That is, in the step S240, a program pulse is applied to the word line coupled to the target and flag memory cells 302 and 310 of the physical page 300 and at the same time the flag memory cell 310 is placed in condition for application of such program pulse by applying a program allowance voltage to the bit line coupled to the flag memory cell 310 and the target memory cells 302 are placed in condition for program inhibition by applying a program inhibit voltage to bit lines coupled to the normal memory cells (target memory cells) 302. Accordingly, the normal memory cells (target memory cells) 302 are locally boosted and the threshold voltages of the normal memory cells 302 do not change, whereas the threshold voltage of the flag memory cell 310 moves from an erase state to a program state. In the step S240, the program pulse may be applied at least once to the flag memory cell 310.

Subsequently, in step S250, data representing "program pass" is stored in the status storage 101 or 140. In a usual case where SPO does not occur, the controller 200 transfers a status read request SRR to the semiconductor memory device 100. Subsequently, it may be determined whether target memory cells have been verified as properly programmed in the program operation, based on status read data SRD received from the semiconductor memory device 100.

When the SPO occurs, the controller 200 may generate a read command for a physical page 300 on which a just previous program operation was being performed, and transfer the read command to the semiconductor memory device 100. The controller 200 checks data stored in the flag memory cell 310 by receiving read data corresponding to the read command from the semiconductor memory device 100. When the data bit stored in the flag memory cell 310 is 1, it may be determined that the step S240 shown in FIG. 9 has not been performed. Therefore, the controller 200 may determine that target memory cells have not been verified as properly programmed in the just previous program operation. When the data bit stored in the flag memory cell 310 is 0, it may be determined that the step S240 shown in FIG. 9 has been performed. Therefore, the controller 200 may determine that the target memory cells have been verified as properly programmed in the just previous program operation.

A method for determining whether the target memory cells have been verified as properly programmed in the just previous program operation by checking the data bit stored in the flag memory cell 310 when the SPO occurs will be described later with reference to FIG. 13B.

Figure 10:
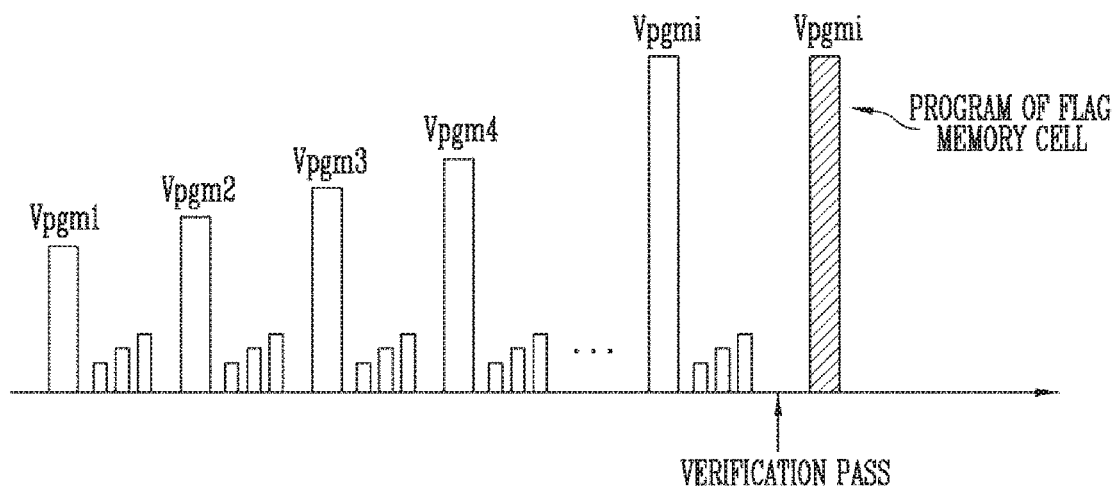
FIG. 10 is a diagram illustrating program and program verification voltage pulses of a program-verify method illustrated in FIG. 9, in a scenario when target memory cells have been verified as properly programmed (program verification pass).

FIG. 10 is a diagram illustrating program and program verification voltage pulses of a program-verify method illustrated in FIG. 9, in a scenario when target memory cells have been verified as properly programmed (program verification pass).

Referring to FIG. 10, the step S210 of applying a first program pulse Vpgm1 to the normal memory cells 302 of the selected physical page 300 is performed. Subsequently, the program verify operation on the normal memory cells 302 is performed by applying verify voltages (S220). Subsequently, at the step S230, it is determined that the target memory cells have not been verified as properly programmed, and at the step S260, it is determined that only a first program loop has been performed. In this scenario, the first program loop is completed and the program pulse of the ISPP is increased by a step voltage. Subsequently, a second program loop is started by applying a second program pulse Vpgm2 to the normal memory cells 302 of the selected physical page 300. In this manner, first to ith program loops are repeatedly performed. As described above, the flag memory cell 310 is not programmed during the first to ith program loops, and remains at the erase state.

FIG. 10 shows a situation in which the target memory cells have been verified as properly programmed as a result of a verify operation after an ith program pulse Vpgmi is applied. Accordingly, the flag memory cell 310 is programmed by proceeding to the step S240 as a result of determination at the step S230. As described above, the normal memory cells 302 are not programmed by the programming pulses applied at the step S240, whereas the threshold voltage of the flag memory cell 310 is increased. FIG. 10 shows an example implementation in which the flag memory cell 310 is programmed using the ith program pulse Vpgmi corresponding to the ith program loop right after the target memory cells have passed program verification. In an embodiment of the disclosed technology, the programming pulse for flag memory cell programming may be one of a series of programming pulses of increasing magnitude under the ISPP scheme. In another embodiment of the disclosed technology, an additional programming pulse can be used to program the flag memory cell. The magnitude of the program pulse applied to the flag memory cell 310 in the step S240 is not limited to the ith program pulse Vpgmi as illustrated in FIG. 10. In an embodiment of the disclosed technology, the magnitude of the program pulse applied to the flag memory cell 310 may be lower than the ith program pulse Vpgmi, or in another embodiment of the disclosed technology, the magnitude of the program pulse applied to the flag memory cell 310 may be higher than the ith program pulse Vpgmi.

In FIG. 10, it is shown that a single pulse (the ith program pulse Vpgmi) is applied to the flag memory cell 310 after "program verify pass." However, in another embodiment of the disclosed technology, two or more program pulses may be applied to program the flag memory cell 310.

Figure 11:
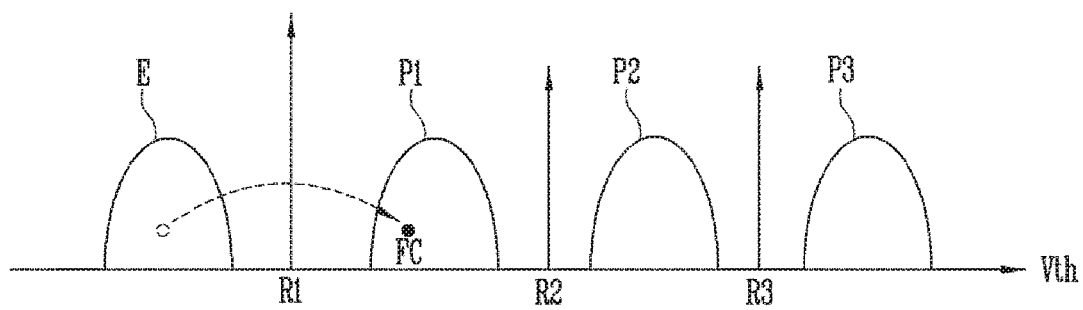
FIG. 11 is a diagram illustrating a program on a flag memory cell in a scenario when program and program verification voltage pulses of a program-verify method are applied to target memory cells as shown in FIG. 10 and the target memory cells have been verified as properly programmed (program verification pass).

FIG. 11 is a diagram illustrating a program on the flag memory cell in a scenario when program and program verification voltage pulses of a program-verify method are applied to target memory cells as shown in FIG. 10 and the target memory cells have been verified as properly programmed (program verification pass).

FIG. 11 shows threshold voltage distributions of memory cells, which correspond to an erase state E and first to third program states P1 to P3, respectively. As an example, it is assumed that the memory cells 302 and 310 included in the selected physical page 300 are implemented as multi-level cells (MLC) for storing two data bits per cell. First to third read voltages R1 to R3 may be used to distinguish four different threshold voltage distributions (the erase state E and the first to third program states P1 to P3) from each other, and these read voltages are used as read voltage in the program verification step.

When the ith program pulse Vpgmi shown in FIG. 10 is applied to the flag memory cell, the threshold voltage of the flag memory cell is increased to one of the program states P1-P3. In FIG. 11, the flag memory cell is indicated by "FC." Upon verification that a program on the normal memory cells 302 of the selected physical page 300 has been properly completed, the ith program pulse Vpgmi is applied to the flag memory cell FC to move the threshold voltage thereof from the erase state E to one of the program states P1-P3.

Figure 12:
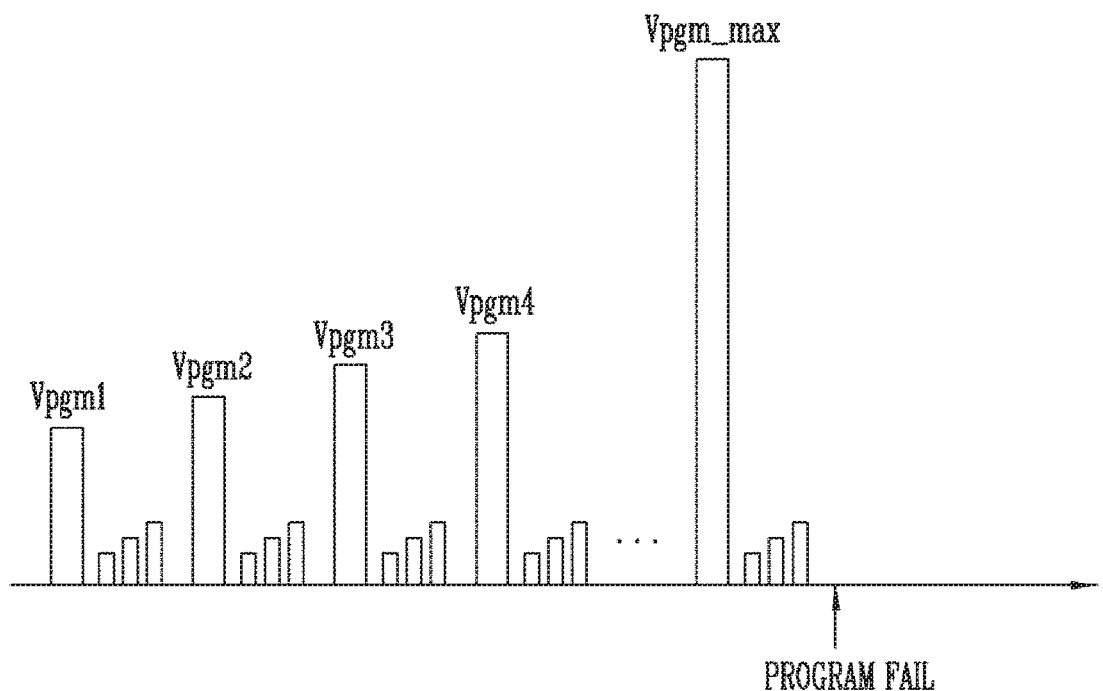
FIG. 12 is a diagram illustrating program and program verification voltage pulses of the program-verify method illustrated in FIG. 9 in a scenario when target memory cells have not been verified as properly programmed (program verification fail).

FIG. 12 is a diagram illustrating program and program verification voltage pulses of the program-verify method illustrated in FIG. 9 in a scenario when target memory cells have not been verified as properly programmed (program verification fail).

Referring to FIG. 12, the step S210 of applying a first program pulse Vpgm1 to the normal memory cells 302 of the selected physical page 300 is performed. Subsequently, the program verify operation on the normal memory cells 302 is performed by applying verify voltages (S220). Subsequently, it is determined that the target memory cells have not been verified as properly programmed at the step S230, and, at the step S260, it is determined that only a first program loop has been performed. In this scenario, the first program loop is completed and the program pulse of the ISPP is increased by a step voltage. Subsequently, a second program pulse Vpgm2 is applied to the normal memory cells 302 of the selected physical page 300 and a second program loop is started. In this manner, program loops are repeatedly performed.

In FIG. 12, a maximum program pulse Vpgm_max is a program pulse applied to the normal memory cells 302 in a program loop of a program-and-verify approach using the incremental step pulse programming (ISPP) scheme at the last iteration of the predetermined number of iterations. When the target memory cells fail to pass program verification until the program loop number reaches the threshold (e.g., maximum) loop number under the program-and-verify approach, it is determined that the program operation has failed. Accordingly, data representing "program fail" is stored in the status storage 101 or 140 by proceeding to the step S280, and the program operation is ended. The step S240 is not performed. Therefore, unlike FIG. 10, no program pulse is applied to the flag memory cell in FIG. 12.

Referring to FIGS. 10 to 12 together, the first read voltage R1 may be used to detect the data bit of the flag memory cell FC. That is, when it is determined that, unlike FIG. 11, the flag memory cell FC is an "on" cell (e.g., erase state E) using the first read voltage R1 as a read reference voltage, it can be seen that the step S240 shown in FIG. 9 has not been performed. Accordingly, it can be seen that the target memory cells have not been verified as properly programmed until the final program operation before the SPO occurred.

When it is determined that, as shown in FIG. 11, the flag memory cell FC is an "off" cell (e.g., first program state P1) using the first read voltage R1 as a read reference voltage, it can be seen that the step S240 shown in FIG. 9 has been performed. Accordingly, it can be seen that the target memory cells have been verified as properly programmed in the final program operation before the SPO occurred.

Figure 13A:
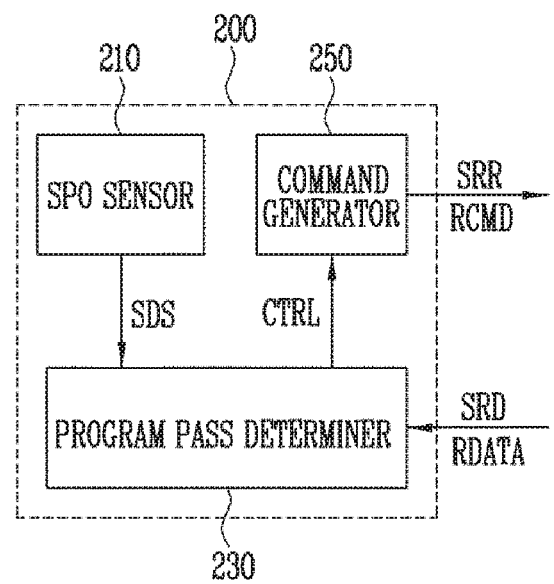
FIG. 13A is a block diagram illustrating an example of a controller based on an embodiment of the disclosed technology.

FIG. 13A is a block diagram illustrating an example of a controller based on an embodiment of the disclosed technology.

Referring to FIG. 13A, the controller 200 implemented based on an embodiment of the disclosed technology includes an SPO sensor 210, a program pass determiner 230, and a command generator 250. The SPO sensor 210 senses whether a sudden power-off (SPO) of the semiconductor memory device 100, the controller 200 or a SPO of the storage device 1000 including such memory devices and controllers has occurred. When the storage device 1000 is turned on, the SPO sensor 210 of the controller 200 senses whether the last turn-off of the storage device 1000 before turn-on of the storage device 1000 was a normal turn-off or a sudden turn-off, and outputs the sensing result as an SPO sensing signal SDS.

The program pass determiner 230 may determine whether the status of a program operation is "program pass" or "program fail" based on status read data SRD stored in the status storage 101 of the semiconductor memory device 100 during a normal operation of the storage device 1000. That is, during the normal operation of the storage device 1000, the program pass determiner 230 generates a control signal CTRL for obtaining the status read data SRD and transfers the control signal CTRL to the command generator 250. The command generator 250 transfers a status read request SRR to the semiconductor memory device 100. The semiconductor memory device 100 transfers the status read data SRD to the controller 200 in response to the status read request SRR. The program pass determiner 230 of the controller 200 may determine whether the target memory cells have been verified as properly programmed or not or whether the target memory cells have been verified as program-failed or not based on the received status read data SRD.

When the storage device 1000 is turned on, the program pass determiner 230 may determine the status of a program operation that was performed just before the turn-off of the storage device 1000—e.g., whether the target memory cells have been verified as properly programmed. The status of a program operation can vary depending on whether the SPO has occurred.

For example, when there was no SPO event before the turn-on of the storage device 1000, the semiconductor memory device 100 must have completed the program operation before shutting down the device. Therefore, there is no need for the program pass determiner 230 to determine the status of the program operation based on the status read data SRD since a memory controller already knows the status of the program operation.

In an embodiment, when the last event before the turn-on of the storage device 1000 was a SPO event, it may be determined whether the target memory cells have been verified as properly programmed or as program-failed based on data stored in the flag memory cell of the semiconductor memory device 100.

In order to perform the above-described process, the program pass determiner 230 first determines whether the turn-off just before the turn-on of the storage device 1000 was a normal turn-off or a turn-off caused by the SPO, by receiving the SPO sensing signal from the SPO sensor 210.

When the turn-off just before the turn-on of the storage device 1000 was a normal turn-off, the program pass determiner 230 may determine that the status of the program operation before the turn-off was "program pass."

When the turn-off just before the turn-on of the storage device 1000 was a turn-off caused by the SPO, the program pass determiner 230 generates the control signal CTRL and outputs the control signal CTRL to the command generator 250 to read data of the flag memory cell. The command generator 250 generates a read command RCMD for reading the data of the flag memory cell and transfers the read command RCMD to the semiconductor memory device 100, in response to the control signal CTRL.

The semiconductor memory device 100 performs a read operation in response to the read command RCMD, and transfers read data RDATA obtained by the read operation to the controller 200. The read data RDATA includes the data stored in the flag memory cell.

The program pass determiner 230 determines whether the status of a program operation before the SPO was "program pass" or "program fail," based on the data stored in the flag memory cell among the read data RDATA. Such an operating method of the controller 200 will be described in more detail with reference to FIGS. 13B and 20.

In another embodiment of the disclosed technology, when the turn-off just before the turn-on of the storage device 1000 was a turn-off caused by the SPO, it may be determined whether the status of the program operation before the turn-off was "program pass" or "program fail" based on whether an error correction of the data read out of a physical page on which the final program operation was performed before the SPO is possible.

In order to perform the above-described process, the program pass determiner 230 first determines whether the turn-off just before the turn-on of the storage device 1000 was a normal turn-off or a turn-off caused by the SPO, by receiving the SPO sensing signal from the SPO sensor 210.

When the turn-off just before the turn-on of the storage device 1000 was a normal turn-off, the program pass determiner 230 may determine that the status of the program operation before the turn-off was "program pass."

When the turn-off just before the turn-on of the storage device 1000 was a turn-off caused by the SPO, the program pass determiner 230 generates the control signal CTRL and outputs the control signal CTRL to the command generator 250 to read data of the physical page on which the final program operation was performed before the SPO. The command generator 250 generates a read command RCMD for reading the data of the physical page on which the final program operation was performed before the SPO and transfers the read command RCMD to the semiconductor memory device 100, in response to the control signal CTRL.

The semiconductor memory device 100 performs a read operation in response to the read command RCMD, and transfers read data RDATA obtained by the read operation to the controller 200. The read data RDATA is the data of the physical page to be finally programmed.

The program pass determiner 230 determines whether the read data RDATA obtained by the read operation has errors and, if it has errors, determined whether the errors can be corrected by performing an error correction operation on the read data RDATA. When the errors can be corrected by the error correction operation, the status of the read data RDATA can be indicated by "ECC pass." By contrast, when the errors cannot be corrected by the error correction operation because the amount of errors exceeds the error correction capacity of the error correction operation, the status of the read data RDATA can be indicated by "ECC fail." The program pass determiner 230 determines whether the status of the program operation before the SPO was "program pass" or "program fail," based on whether the status of the read data DATA is "ECC pass" or "ECC fail." To this end, the program pass determiner 230 may include an error correction block. Such an operating method of the controller 200 will be described in more detail with reference to FIG. 24.

Figure 13B:
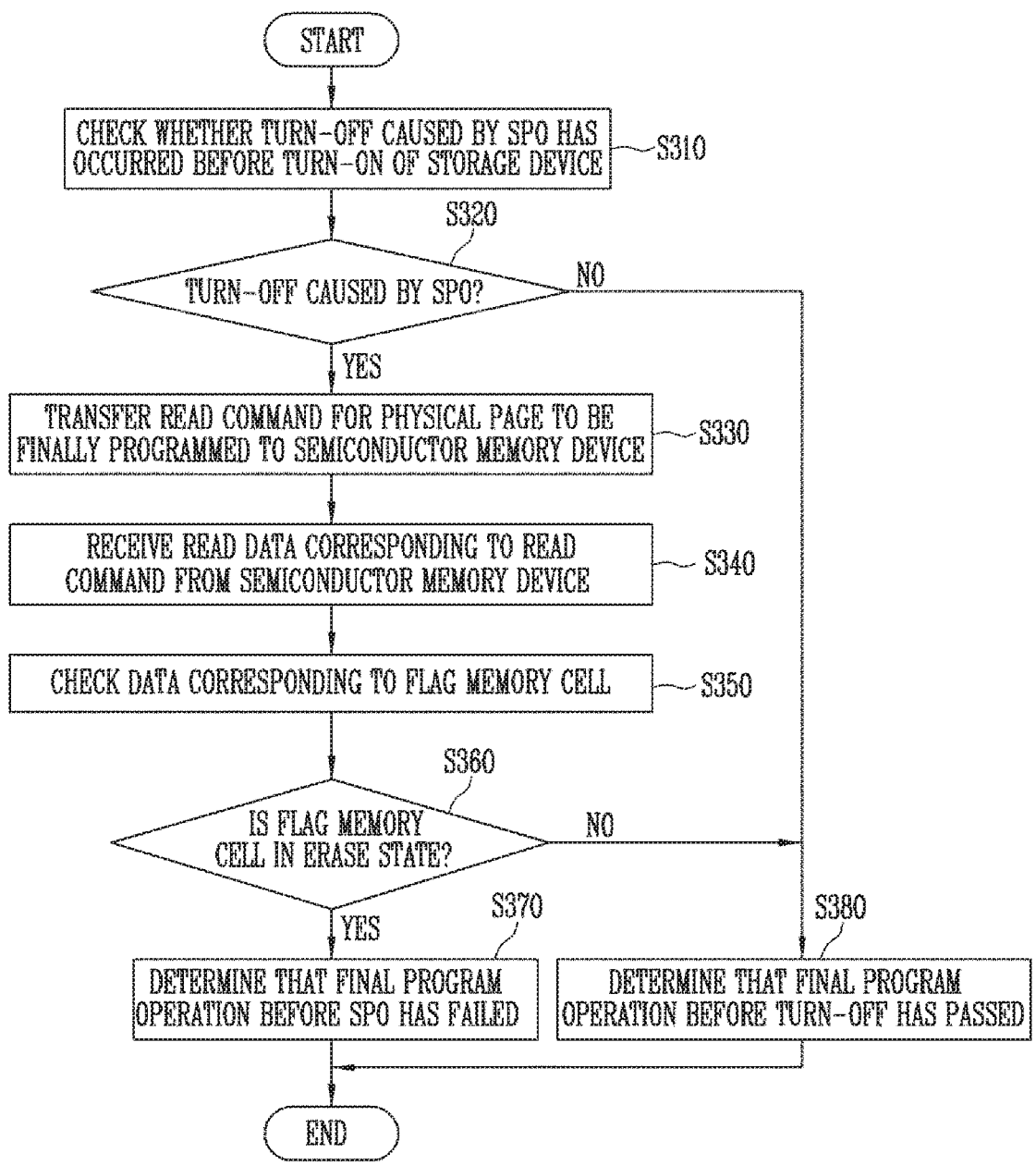
FIG. 13B is a flowchart illustrating an example of an operating method of the controller based on an embodiment of the disclosed technology.

FIG. 13B is a flowchart illustrating an example of an operating method of the controller based on an embodiment of the disclosed technology. In particular, FIG. 13B shows an operating method of the controller after the storage device 1000 is turned on.

Referring to FIG. 13B, when the storage device 1000 is turned on, the SPO sensor 210 of the controller 200 checks whether a turn-off caused by SPO has occurred before the turn-on of the storage device 1000 (S310). Subsequently, in step S320, the program pass determiner 230 determines whether the turn-off just before the turn-on of the storage device 1000 is caused by the SPO.

When the turn-off of the storage device 1000 is not caused by the SPO but is a normal turn off and the final program operation before the turn-off was completed normally, the program pass determiner 230 may determine that the status of the final program operation before the turn-off was "program pass" (S380). This is because the program operation was completed before the storage device 1000 is normally turned off.

When the turn-off of the storage device is caused by the SPO, a read command for a physical page 300 on which the final program operation was performed before the SPO is transferred to the semiconductor memory device 100 (S330). To this end, the program pass determiner 230 generates a control signal CTRL for reading data of the physical page including a flag memory cell, and transfers the control signal CTRL to the command generator 250. The command generator 250 generates a read command RCMD for reading data of the physical page including the flag memory cell and transfers the read command RCMD to the semiconductor memory device 100, based on the control signal CTRL. The semiconductor memory device 100 receiving the read command reads data stored in memory cells of the physical page 300, and transfers the read data to the controller 200. The controller 200 receives the read data from the semiconductor memory device 100 (S340).

The program pass determiner 230 of the controller 200 checks data corresponding to the flag memory cell 310 among the received read data (S350). Subsequently, the program pass determiner 230 determines whether the flag memory cell is in the erase state E (S360). Referring to FIG. 11 together with FIG. 13B, the flag memory cell may be in the erase state E or the first program state P1.

As the determination result of the step S360, when the flag memory cell is in the erase state E, the program pass determiner 230 determines that the final program operation before the SPO has failed (S370). As the determination result of the step S360, when the flag memory cell is not in the erase state E, the program pass determiner 230 determines that the status of the final program operation before the turn-off was "program pass" (S380).

When it is determined that the final program operation before the SPO has failed, the controller 200 may perform a subsequent operation corresponding to the determination result. For example, the command generator 250 may generate a program command for re-performing the program operation that has failed, and transfer the program command to the semiconductor memory device 100. In addition, various operations corresponding to the program fail may be performed.

Figure 14:
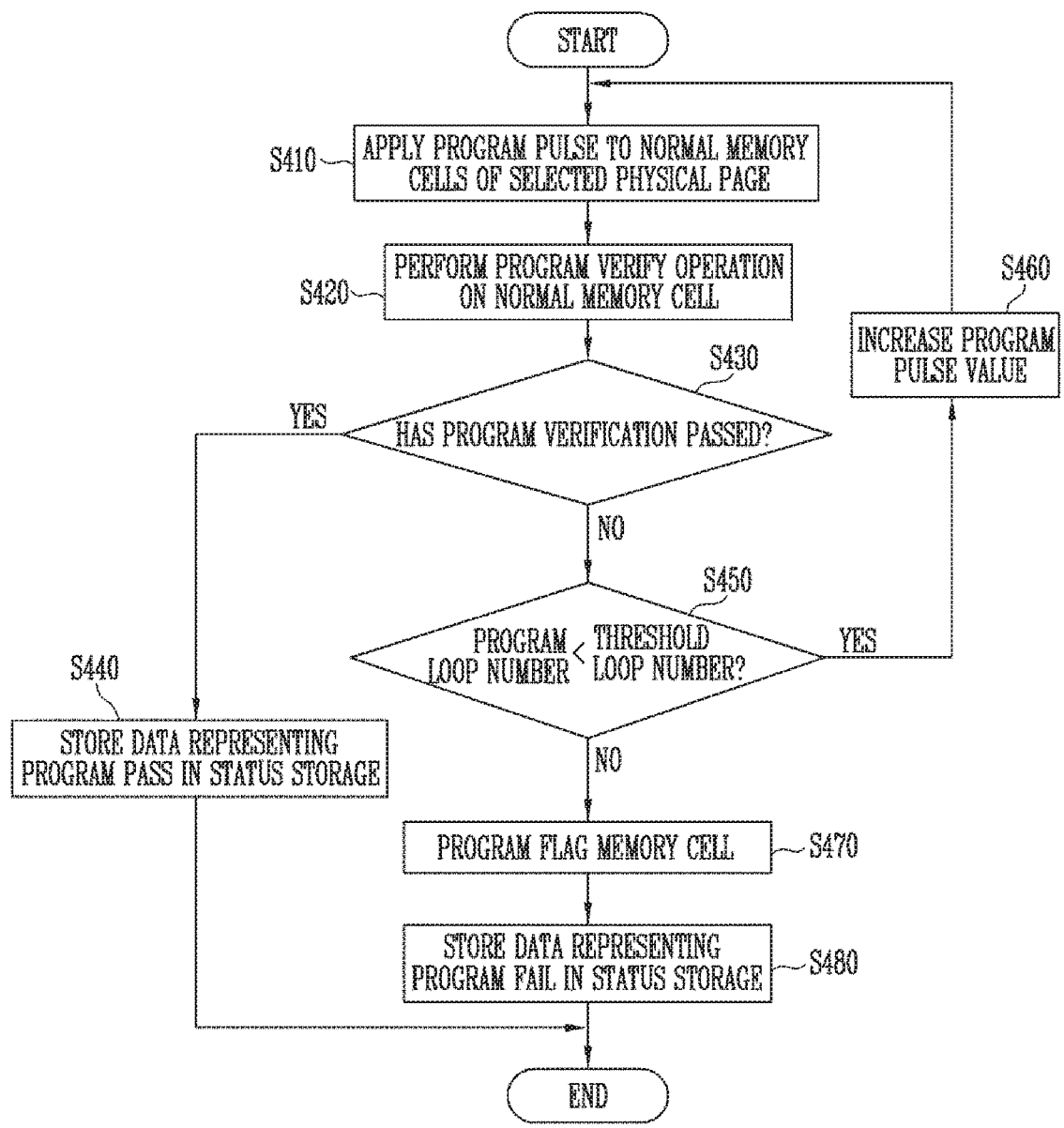
FIG. 14 is a flowchart illustrating an example of the operating method of the semiconductor memory device based on another embodiment of the disclosed technology.

FIG. 14 is a flowchart illustrating an example of the operating method of the semiconductor memory device based on another embodiment of the disclosed technology.

Referring to FIG. 14, a program operation according to the operating method of the semiconductor memory device implemented based on another embodiment of the disclosed technology is performed. First, a program pulse is applied to normal memory cells 302 included in the normal memory cell group 301 of the selected physical page 300 (S410). Subsequently, a program verify operation is performed on the normal memory cells (S420). Subsequently, in step S430, it is determined whether target memory cells have been verified as properly programmed in a program verification. When the target memory cells fail to pass the program verification, it is determined whether the current program loop number is smaller than a threshold (e.g., maximum) loop number (S450). When the current program loop number is smaller than the threshold loop number, the magnitude of a program pulse value is increased so as to increase threshold voltages of memory cells that have not been completely programmed (S460), and a subsequent program loop is performed by proceeding to the step S410.

The steps S410, S420, S430, S450, and S460 may constitute a program loop using the above-described ISPP scheme. The steps S410, S420, S430, S450, and S460 shown in FIG. 14 may be substantially identical to the steps S210, S220, S230, S260, and S270 shown in FIG. 9.

When the program loop number reaches the threshold loop number as the determination result of the step S450, the flag memory cell 310 in the physical page 300 is programmed (S470), and data representing "program fail" is stored in the status storage 101 or 140 (S480). Subsequently, the program operation is ended. Therefore, a final program operation fails.

In a usual case where SPO does not occur, the controller 200 transfers a status read request SRR to the semiconductor memory device 100. Subsequently, it may be determined whether target memory cells have been verified as properly programmed in the program operation, based on status read data SRD received from the semiconductor memory device 100.

When the SPO occurs, the controller 200 may generate a read command for a physical page 300 on which a just previous program operation was being performed, and transfer the read command to the semiconductor memory device 100. The controller 200 checks data stored in the flag memory cell 310 by receiving read data corresponding to the read command from the semiconductor memory device 100. When the data bit stored in the flag memory cell 310 is 1, it may be determined that the step S470 shown in FIG. 14 has not been performed. Therefore, the controller 200 may determine that target memory cells have been verified as properly programmed in the just previous program operation. When the data bit stored in the flag memory cell 310 is 0, it may be determined that the step S470 shown in FIG. 14 has been performed. Therefore, the controller 200 may determine that the just previous program operation failed.

A method for determining whether the target memory cells have been verified as properly programmed in the just previous program operation by checking the data bit stored in the flag memory cell 310 when the SPO occurs will be described later with reference to FIG. 17.

When it is determined that the target memory cells have been verified as properly programmed in the program verification at the step S430, data representing "program pass" is stored in the status storage 101 or 140 (S440), and the program operation is ended.

Referring to FIGS. 9 and 14 together, it can be seen that, while the flag memory cell is programmed (S240) when the target memory cells have been verified as properly programmed in the program verification in the embodiment according to FIG. 9, the flag memory cells is programmed (S470) when the program verification fails in the embodiment according to FIG. 14.

Figure 15:
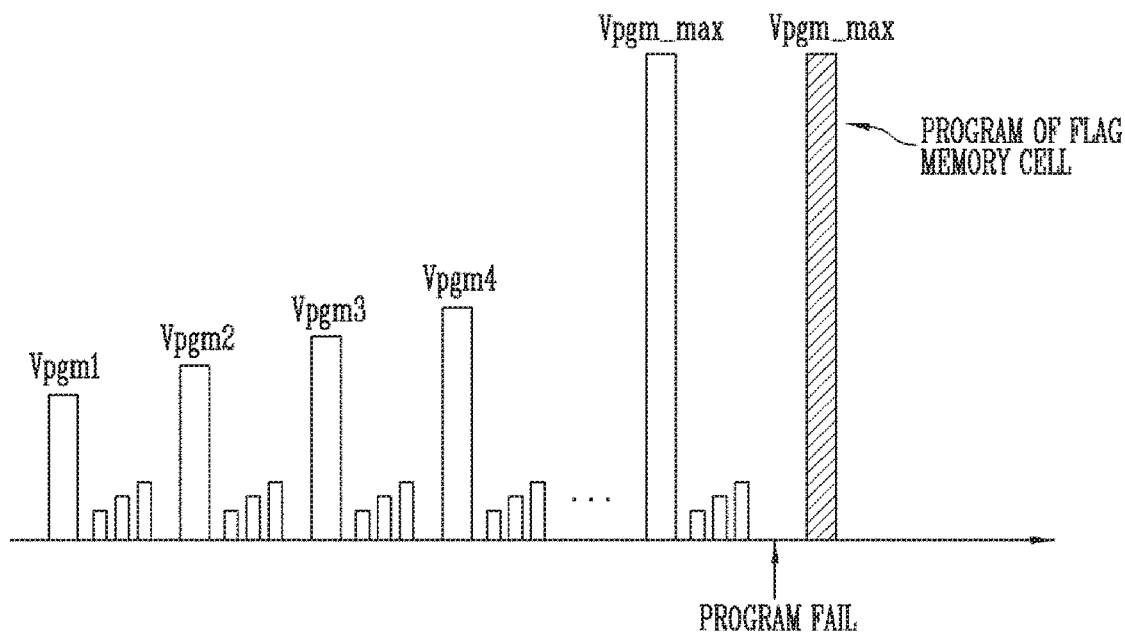
FIG. 15 is a diagram illustrating program and program verification voltage pulses of the program-verify method illustrated in FIG. 14, in a scenario when target memory cells have not been verified as properly programmed (program verification fail).

FIG. 15 is a diagram illustrating program and program verification voltage pulses of the program-verify method illustrated in FIG. 14, in a scenario when target memory cells have not been verified as properly programmed (program verification fail).

Referring to FIG. 15, the step S410 of applying a first program pulse Vpgm1 to the normal memory cells 302 of the selected physical page 300 is performed. Subsequently, the program verify operation on the normal memory cells 302 is performed by applying verify voltages (S420). Subsequently, at the step S430, it is determined that the target memory cells have not been verified as properly programmed, and, at the step S450, it is determined that only a first program loop has been performed. In this scenario, the first program loop is completed and the program pulse of the ISPP is increased by a step voltage. Subsequently, a second program loop is started by applying a second program pulse Vpgm2 to the normal memory cells 302 of the selected physical page 300. In this manner, program loops are repeatedly performed.

In FIG. 15, a maximum program pulse Vpgm_max is a program pulse applied to the normal memory cells 302 in a program loop of a program-and-verify approach using the incremental step pulse programming (ISPP) scheme at the last iteration of the predetermined number of iterations. When the target memory cells fail to pass program verification until the program loop number reaches the threshold (e.g., maximum) loop number under the program-and-verify approach, it is determined that the program operation has failed. Accordingly, the flag memory cell is programmed by proceeding to the step S470. In the step S470, the normal memory cells 302 are not programmed, and the threshold voltage of the flag memory cell 310 is increased. FIG. 15 shows an example in which the flag memory cell 310 is programmed using a maximum program pulse Vpgm_max corresponding to the maximum program loop. However, according to the operating method of the semiconductor memory device implemented based on an embodiment of the disclosed technology, the magnitude of the program pulse applied to the flag memory cell 310 in the step S470 is not limited to the maximum program pulse Vpgm_max as illustrated in FIG. 15. In an embodiment of the disclosed technology, the magnitude of the program pulse applied to the flag memory cell 310 may be lower than the maximum program pulse Vpgm_max, or in another embodiment of the disclosed technology, the magnitude of the program pulse applied to the flag memory cell 310 may be higher than the maximum program pulse Vpgm_max.

FIG. 15 shows the maximum program pulse Vpgm_max is applied once to the flag memory cell 310 after the program verification fails. However, in another embodiment of the disclosed technology, two or more program pulses may be applied to the flag memory cell 310.

Figure 16:
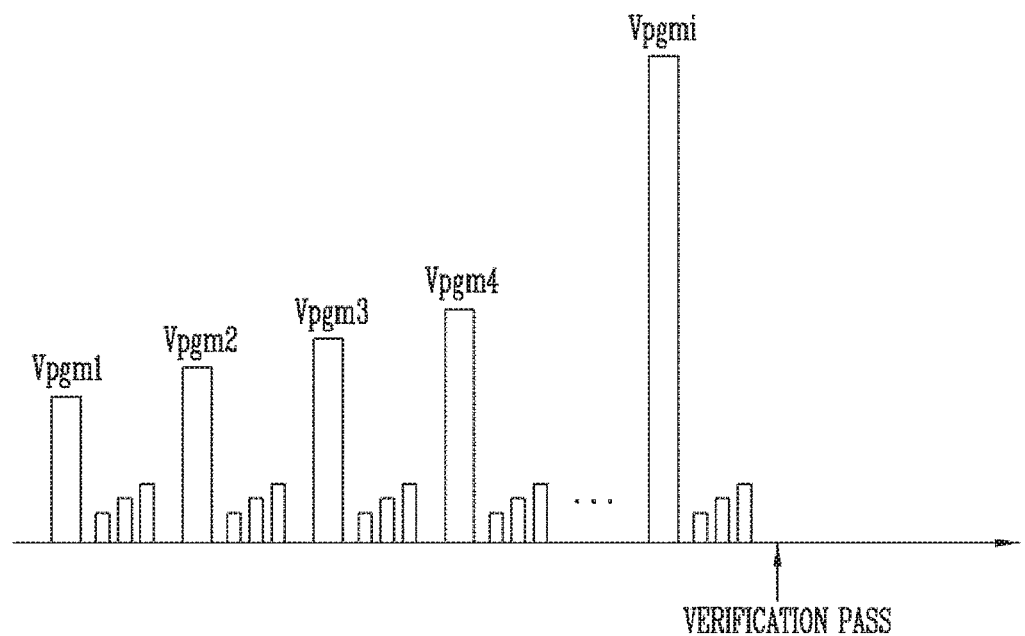
FIG. 16 is a diagram illustrating program and program verification voltage pulses of the program-verify method illustrated in FIG. 14, in a scenario when target memory cells have been verified as properly programmed (program verification pass).

FIG. 16 is a diagram illustrating program and program verification voltage pulses of the program-verify method illustrated in FIG. 14, in a scenario when target memory cells have been verified as properly programmed (program verification pass).

Referring to FIG. 16, the step S410 of applying a first program pulse Vpgm1 to the normal memory cells 302 of the selected physical page 300 is performed. Subsequently, the program verify operation on the normal memory cells 302 is performed by applying verify voltages (S420). Subsequently, at the step S430, it is determined that the target memory cells have not been verified as properly programmed, and, at the step S450, it is determined that only a first program loop has been performed. In this scenario, the first program loop is completed and the program pulse of the ISPP is increased by a step voltage. Subsequently, a second program loop is started by applying a second program pulse Vpgm2 to the normal memory cells 302 of the selected physical page 300. In this manner, program loops are repeatedly performed.

FIG. 16 shows a situation in which the target memory cells have been verified as properly programmed as a result of a verify operation after an ith program pulse Vpgmi is applied. Accordingly, data representing program pass is stored in the status storage 101 or 140 by proceeding to the step S440, and the program operation is ended. The step S470 is not performed. Therefore, unlike FIG. 15, no program pulse is applied to the flag memory cell in FIG. 16.

Figure 17:
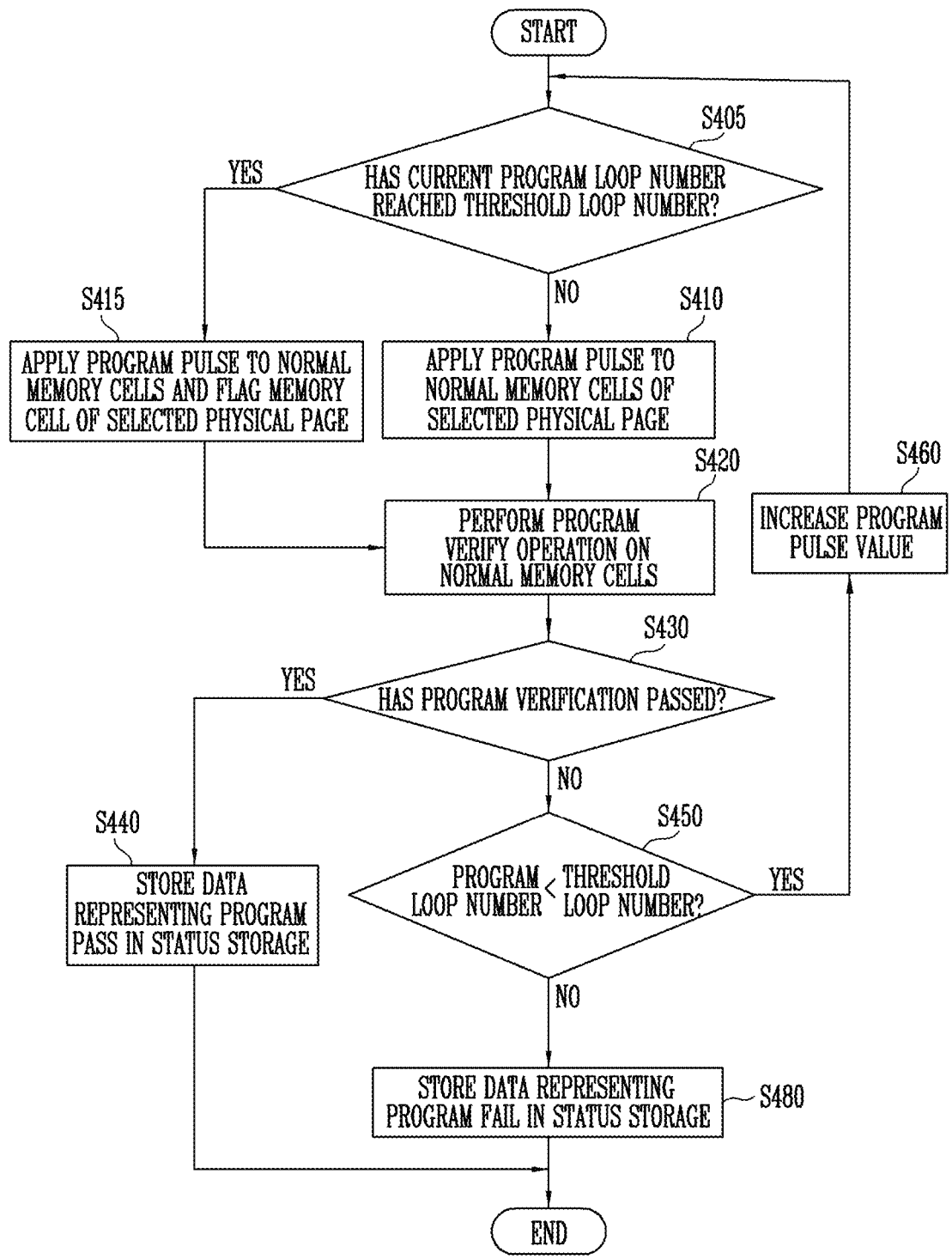
FIG. 17 is a flowchart illustrating an example of the operating method of the semiconductor memory device based on another embodiment of the disclosed technology.

FIG. 17 is a flowchart illustrating an example of the operating method of the semiconductor memory device based on another embodiment of the disclosed technology. Steps S410, S420, S430, S440, S450, S460, and S480 shown in FIG. 17 may be substantially identical to the steps S410, S420, S430, S440, S450, S460, and S480 shown in FIG. 14. Unlike FIG. 14, in the embodiment shown in FIG. 17, the step S470 is not performed, and steps S405 and S415 may be performed instead of the step S470.

Referring to FIG. 17, a program operation according to the operating method of the semiconductor memory device implemented based on another embodiment of the disclosed technology is performed. First, it is determined whether a current program loop number has reached a threshold (e.g., maximum) loop number (S405).

When the current program loop number reaches the threshold loop number, it may be determined that a program loop being currently performed is the last program loop. Accordingly, a program pulse is applied to normal memory cells and a flag memory cell of the selected physical page (S415).

In case the current program loop number does not reach the threshold loop number, a program pulse is applied to the normal memory cells 302 included in the normal memory cell group 301 of the selected physical page 300 (S410).

Subsequently, a program verify operation on the normal memory cells is performed (S420). Subsequently, in the step S430, it is determined whether the target memory cells have been verified as properly programmed. When the target memory cells have not been verified as properly programmed, it is determined whether the current program loop number is smaller than the threshold loop number (S450). When the current program loop number is smaller than the threshold loop number, the magnitude of a program pulse is increased to increase threshold voltages of memory cells that have not been completely programmed (S460), and a subsequent program loop is performed by proceeding to the step S405. The steps S405, S410, S415, S420, S430, S450, and S460 may constitute a program loop using the above-described ISPP scheme.

When the program loop number reaches the threshold loop number as the determination result of the step S450, data representing program fail is stored in the status storage 101 or 140 (S480). Subsequently, the program operation is ended. Therefore, a final program operation fails.

In a usual case where SPO does not occur, the controller 200 transfers a status read request SRR to the semiconductor memory device 100. Subsequently, it may be determined whether target memory cells have been verified as properly programmed in the program operation, based on status read data SRD received from the semiconductor memory device 100.

When the SPO occurs, the controller 200 may generate a read command for a physical page 300 on which a just previous program operation was being performed, and transfer the read command to the semiconductor memory device 100. The controller 200 checks data stored in the flag memory cell 310 by receiving read data corresponding to the read command from the semiconductor memory device 100. When the data bit stored in the flag memory cell 310 is 1, the controller 200 may determine that target memory cells have been verified as properly programmed in the just previous program operation. When the data bit stored in the flag memory cell 310 is 0, the controller 200 may determine that the just previous program operation failed.

A method for determining whether target memory cells have been verified as properly programmed in the just previous program operation by checking the data bit stored in the flag memory cell 310 when the SPO occurs will be described later with reference to FIG. 20.

When target memory cells have been verified as properly programmed as the determination result of the step S430, data representing "program pass" is stored in the status storage 101 or 140 (S440), and the program operation is ended.

Referring to FIGS. 14 and 17 together, it can be seen that, while the flag memory cell is programmed (S470) when the target memory cells have not been verified as properly programmed in the program verification in the embodiment according to FIG. 14, the program pulse is applied to the flag memory cell and the normal memory cells (S415) when the program loop number reaches the threshold loop number in the embodiment according to FIG. 17.

Figure 18:
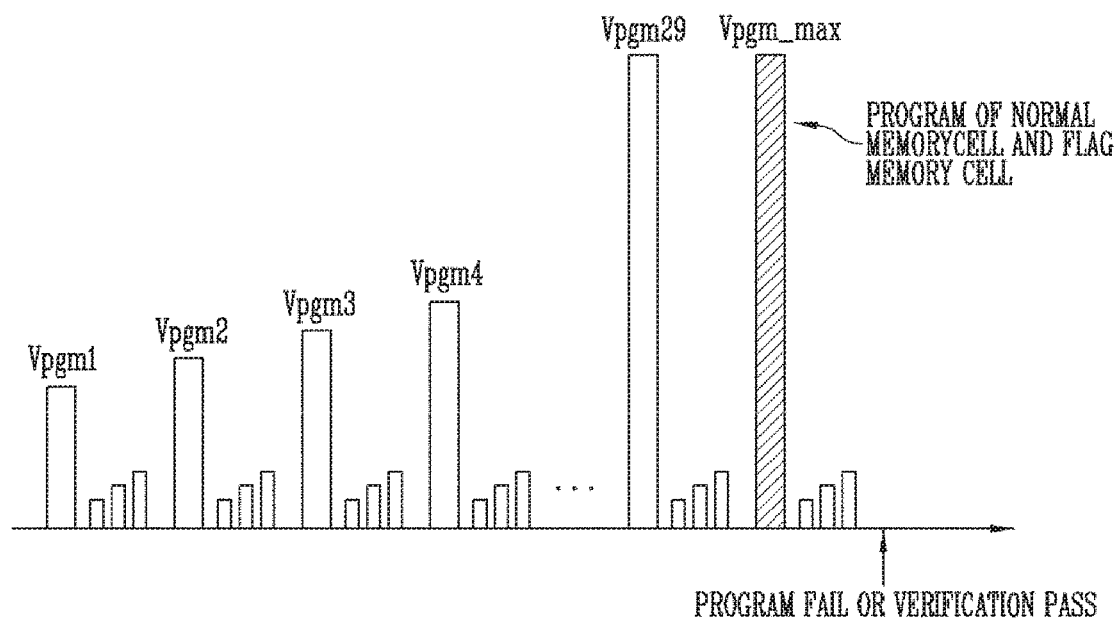
FIG. 18 is a diagram illustrating program and program verification voltage pulses of the program-verify method illustrated in FIG. 17 in a scenario when a program loop is performed up to a threshold loop number.

FIG. 18 is a diagram illustrating program and program verification voltage pulses of the program-verify method illustrated in FIG. 17 in a scenario when the program loop is performed up to the threshold loop number. In FIG. 18, for convenience of description, a case where the threshold loop number is 30 is illustrated as an example.

Referring to FIG. 18, it is determined whether the program loop number is equal to the threshold loop number in a first program loop (S405). Since the threshold loop number is 30, the step S410 of applying a first program pulse Vpgm1 to the normal memory cells 302 of the selected physical page 300 is performed. Subsequently, a program verify operation on the normal memory cells 302 is performed by applying verify voltages (S420). Subsequently, it is determined the target memory cells have not been verified as properly programmed at the step S430, and it is determined that only a first program loop has been performed at the step S450. Therefore, the first program loop is completed and the magnitude of the program pulse increases. Subsequently, the program loop number and the threshold loop number are compared in a second program loop (S405). Since the program loop number does not reach the threshold loop number, a second program pulse Vpgm2 is applied to the normal memory cells 302 of the selected physical page 300 and the second program loop is started. In this manner, program loops are repeatedly performed. The program loops are repeated up to a twenty-ninth program loop in which a twenty-ninth program pulse Vpgm29 is applied to the normal memory cells 302.

In FIG. 18, when the target memory cells have not been verified as properly programmed even though the program loops are performed up to the twenty-ninth program loop, a thirtieth program loop is started, so that the step S405 is performed. Since the current program loop reaches 30, which is the threshold loop number, the step S415 of applying a maximum program pulse Vpgm_max to the normal memory cells 302 and the flag memory cell of the selected physical page 300 is performed. Accordingly, the flag memory cell is programmed in addition to the normal memory cells. That is, in the step S415, threshold voltages of the normal memory cells and the flag memory cell are all increased.

As discussed above, the flag memory cells can be programmed by using one or more ISPP programming pulses or by using additional programming pulse outside the ISPP programming pulses. In an embodiment of the disclosed technology, as shown in FIG. 15, when the program verification fails even with the maximum number (threshold loop number) of programming pulses of the program loop, another program pulse for programming the flag memory cell is additionally applied. In another embodiment of the disclosed technology, as shown in FIG. 18, when the program loop number reaches the threshold loop number, a program pulse (e.g., the last program pulse corresponding to the maximum loop number) is applied to both the normal memory cells and the flag memory cell during a corresponding program loop.

In FIG. 18, when the last program loop is performed, the flag memory cell is programmed using the corresponding program pulse regardless of whether the target memory cells have been verified as properly programmed. In an implementation where the flag memory cell is programmed to indicate that the target memory cells have failed to be verified as properly programmed, the example shown in FIG. 18 can save the time required to program the flag memory cell since it does not need to apply an additional program pulse to program the flag memory cells.

However, in a situation where the target memory cells finally pass program verification after the last programming pulse is applied to program the flag memory cells and then SPO occurs, these properly programmed target memory cells can be mistaken as failed memory cells. In this case, when the SPO occurs after the target memory cells are finally programmed with the last programming pulse, which is also applied to the flag memory cells to indicate the status of "program fail" but before the memory controller stores the status of "program pass" in a persistent memory area (e.g., status storage), the flag memory cell has wrong status information. Subsequently, when the power is back on after the SPO event, the controller cannot refer to data of the status storage and it should determine whether the target memory cells were properly programmed before the SPO event based on the flag memory cell. As a result, the controller will mistake properly programmed memory cells as failed memory cells.

However, the above-described case is a very rare case. The above-described case occurs only when the SPO occurs just after the target memory cells are programmed with the last programming pulse within the threshold loop number. In many cases, when the target memory cells are verified as properly programmed within the threshold loop number, the controller is informed of the status of the target memory cells and store it in a persistent memory area as long as the SPO does not occur during that short time period. Moreover, even if such a rare case occurs, it does not harm the data reliability because the controller will perform a reprogramming because of the "program fail" status stored in the flag memory cell.

Figure 19:
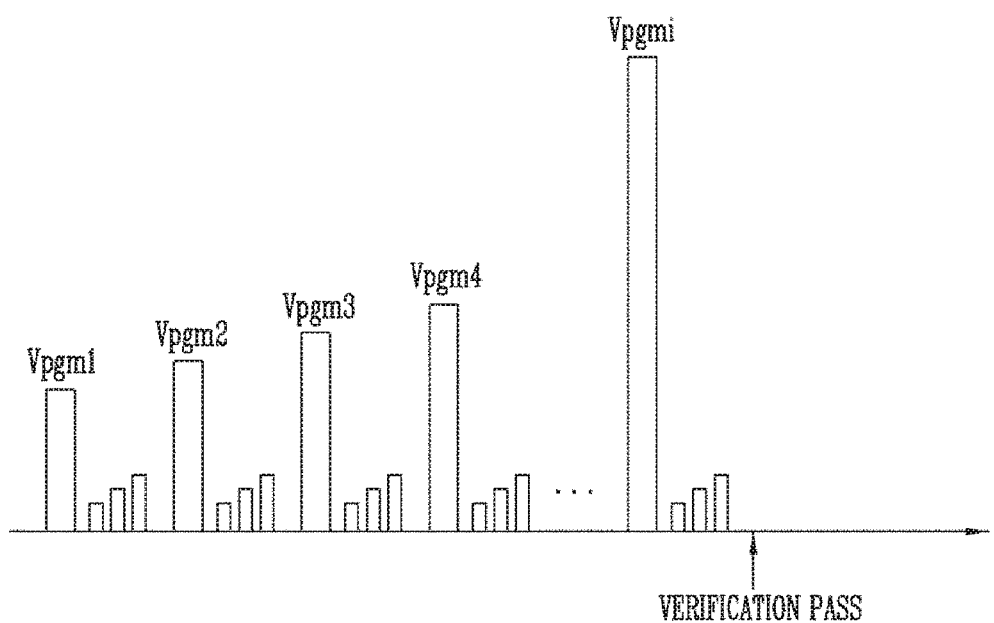
FIG. 19 is a diagram illustrating program and program verification voltage pulses of the program-verify method illustrated in FIG. 17, in a scenario when target memory cells have been verified as properly programmed within the threshold loop number.

FIG. 19 is a diagram illustrating program and program verification voltage pulses of the program-verify method illustrated in FIG. 17, in a scenario when target memory cells have been verified as properly programmed within the threshold loop number.

Referring to FIG. 19, it is determined whether the program loop number is equal to the threshold loop number in a first program loop (S405). Since the threshold loop number is 30, the step S410 of applying a first program pulse Vpgm1 to the normal memory cells 302 of the selected physical page 300 is performed. Subsequently, a program verify operation is performed on the normal memory cells 302 by applying verify voltages (S420). Subsequently, the target memory cells fail to be verified as properly programmed in the program verification at the step S430, and it is determined if the program loop number has exceeded the threshold (e.g., maximum) loop number at the step S450. At this time, only a first program loop has been performed, and thus the first program loop is completed and the magnitude of the program pulse is increased by a step voltage. Subsequently, the program loop number and the threshold loop number are compared in a second program loop (S405). Since the program loop number does not reach the threshold loop number, a second program pulse Vpgm2 is applied to the normal memory cells 302 of the selected physical page 300 to perform the second program loop. In this manner, program loops are repeatedly performed.

FIG. 19 shows a situation in which the target memory cells have been verified as properly programmed as a result of a verify operation after an ith program pulse Vpgmi is applied. Here, i is a value smaller than 30. In this case, the target memory cells are verified as properly programmed in a program loop before program loops are performed up to the threshold loop number. Accordingly, data representing "program pass" is stored in the status storage 101 or 140 by proceeding to the step S440, and the program operation is ended.

Figure 20:
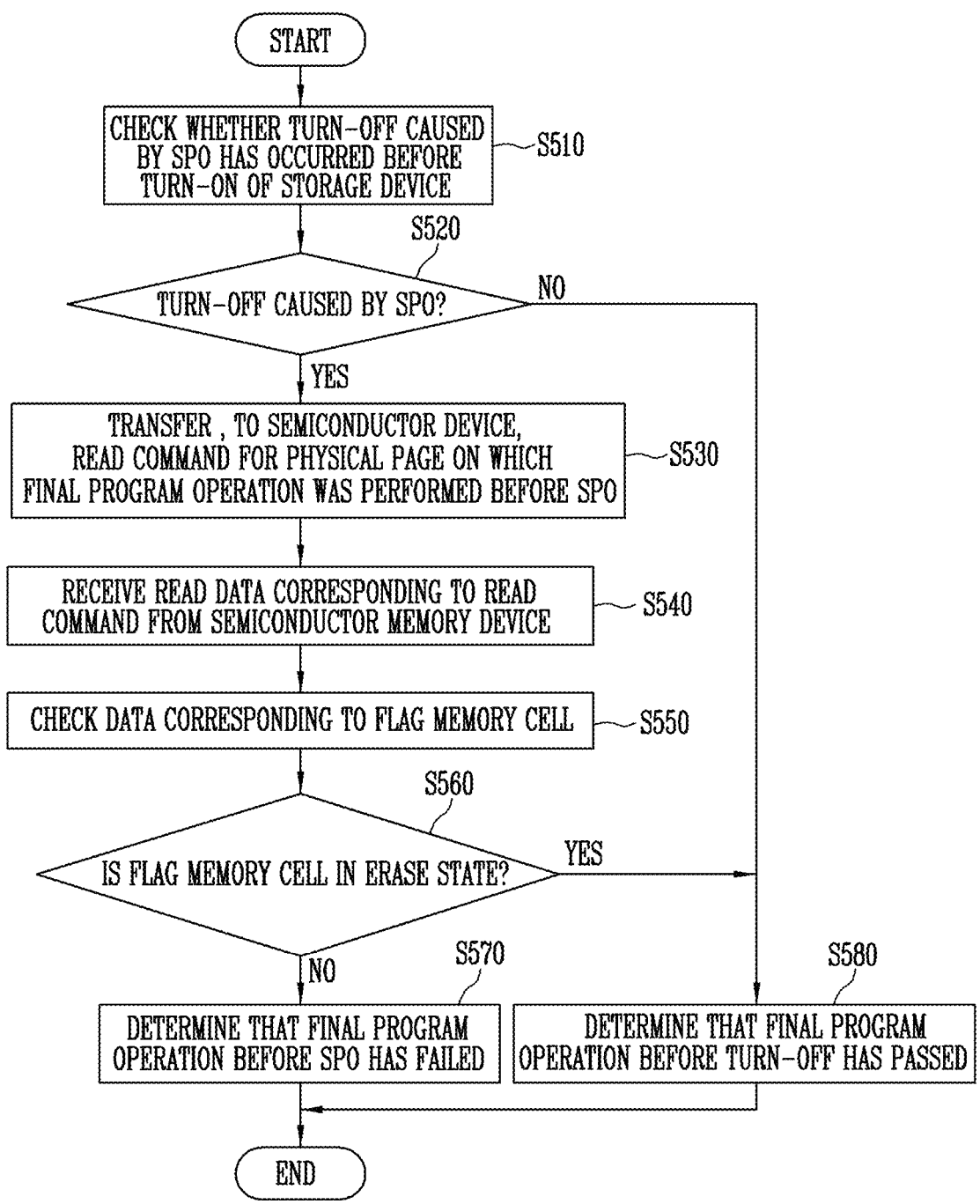
FIG. 20 is a flowchart illustrating an example of an operating method of the controller based on an embodiment of the disclosed technology.

FIG. 20 is a flowchart illustrating an example of an operating method of the controller based on an embodiment of the disclosed technology. In particular, the flowchart shown in FIG. 20 illustrates an operating method of the controller after the storage device 1000 is turned on. Hereinafter, the operating method shown in FIG. 20 will be described with reference to FIG. 13A together.

Referring to FIG. 20, when the storage device 1000 is turned on, the SPO sensor 210 of the controller 200 checks whether a turn-off caused by SPO occurred before the turn-on of the storage device 1000 (S510). Subsequently, in step S520, the program pass determiner 230 determines whether a turn-off just before the turn-on of the storage device 1000 is caused by the SPO.

When the turn-off of the storage device 1000 is not caused by the SPO but is a normal turn off, the program pass determiner 230 may determine that a final program operation before the turn-off was done without interruption (S580). This is because the program operation was completed before the storage device 1000 is normally turned off.

When the turn-off of the storage device is caused by the SPO, a read command for a physical page 300 on which the final program operation was performed before the SPO is transferred to the semiconductor memory device 100 (S530). To this end, the program pass determiner 230 generates a control signal CTRL for reading data of the physical page including a flag memory cell, and transfers the control signal CTRL to the command generator 250. The command generator 250 generates a read command RCMD for reading data of the physical page including the flag memory cell and transfers the read command RCMD to the semiconductor memory device 100, based on the control signal CTRL. The semiconductor memory device 100 receiving the read command reads data stored in memory cells of the physical page 300, and transfers the read data to the controller 200. The controller 200 receives the read data from the semiconductor memory device 100 (S540).

The program pass determiner 230 of the controller 200 checks data corresponding to the flag memory cell 310 among the received read data (S550). Subsequently, the program pass determiner 230 determines whether the flag memory cell is in the erase state E (S560).

As the determination result of the step S560, when the flag memory cell is in the erase state E, the program pass determiner 230 determines that the final program operation before the turn-off has passed (S580). As the determination result of the step S560, when the flag memory cell is not in the erase state E, the program pass determiner 230 determines that the status of the final program operation before the SPO was "program fail" (S570).

When it is determined that the final program operation before the SPO has failed, the controller 200 may perform a subsequent operation corresponding to the determination result. For example, the command generator 250 may generate a program command for re-performing the program operation that has failed, and transfer the program command to the semiconductor memory device 100. In addition, various operations corresponding to the program fail may be performed.

Figure 21:
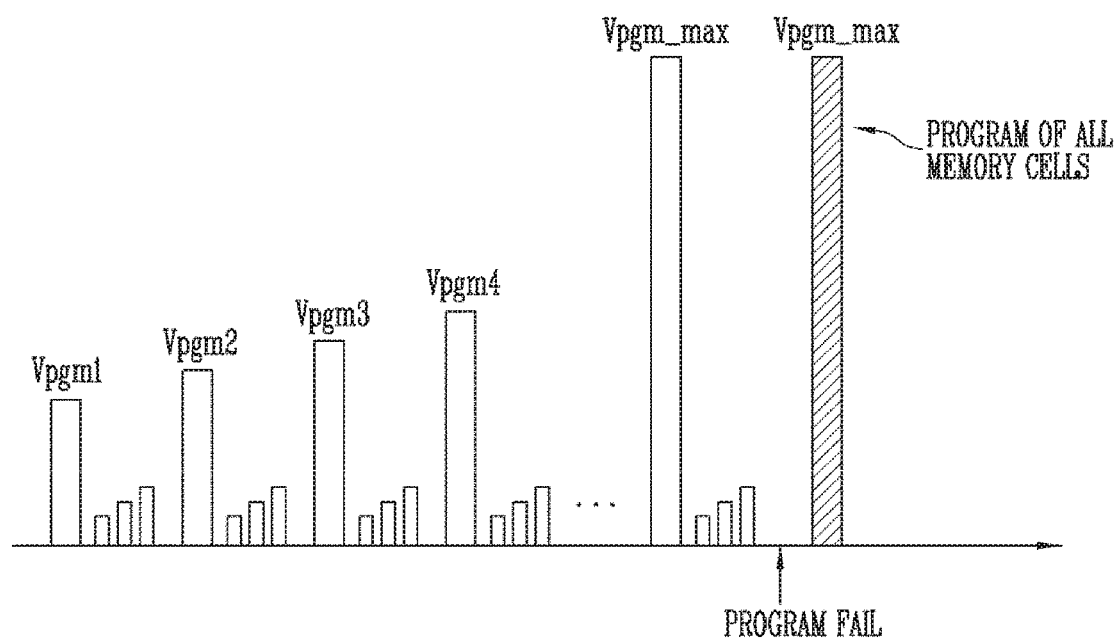
FIG. 21 is a diagram illustrating an example method for applying a dummy program pulse based on another embodiment of the disclosed technology in a scenario when target memory cells have not been verified as properly programmed (program verification fail).
Figure 22:
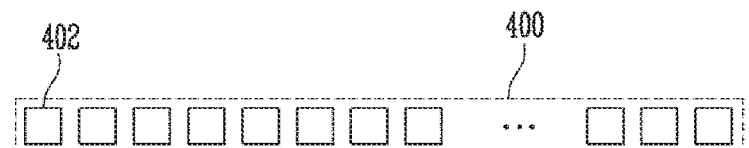
FIG. 22 is a diagram illustrating an example of a physical page including no flag memory cell based on another embodiment of the disclosed technology.

FIG. 21 is a diagram illustrating an example method for applying a dummy program pulse based on another embodiment of the disclosed technology in a scenario when target memory cells have not been verified as properly programmed (program verification fail). FIG. 22 is a diagram illustrating an example of a physical page including no flag whether the status of a previous program operation memory cell based on another embodiment of the disclosed technology. Hereinafter, still another embodiment of the disclosed technology will be described with reference to FIGS. 21 and 22.

FIG. 21 shows a case where first to maximum program loops are performed. In this case, a maximum program pulse Vpgm_max is a program pulse applied in a program loop in which a program loop number reaches a threshold loop number. In the maximum program loop, the maximum program pulse Vpgm_max corresponding to the maximum program loop is applied to all memory cells 402 of a selected physical page 400 shown in FIG. 22. Referring to FIG. 22, the physical page 400 includes only normal memory cells 402, and does not include any separate flag memory cell.

When target memory cells fail to be verified as properly programmed until the program loop number reaches the threshold loop number even though program loops are repeatedly performed, it is determined that a program operation has failed. Accordingly, the program pulse Vpgm_max is applied to all the memory cells 402 of the physical page 400. After an SPO occurs, the controller 200 reads data of the selected physical page 400, and determines whether the target memory cells were properly programmed at the final program operation before the SPO based on whether the status of a read operation on the read data is "ECC pass" or "ECC fail."

Figure 23:
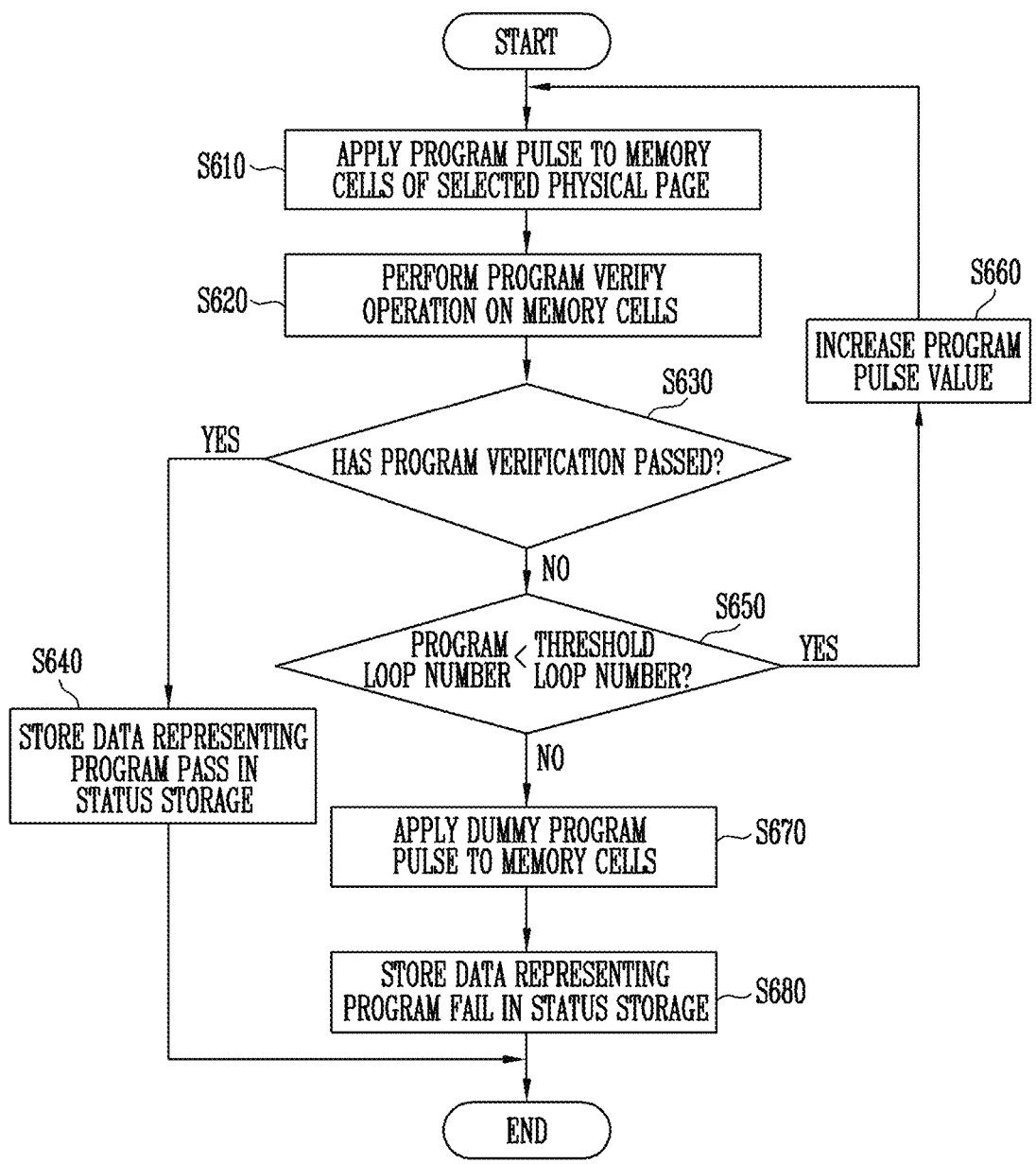
FIG. 23 is a flowchart illustrating an example method based on the methods illustrated in FIGS. 21 and 22.

FIG. 23 is a flowchart illustrating an example method based on the methods illustrated in FIGS. 21 and 22.

Referring to FIG. 23, a program operation according to the operating method of the semiconductor memory device implemented based on another embodiment of the disclosed technology is performed. First, a program pulse is applied to the memory cells 402 of the selected physical page 400 (S610). Subsequently, a program verify operation on the memory cells is performed (S620). Subsequently, in step S630, it is determined whether target memory cells have been verified as properly programmed at the program verification. When the program verification fails, it is determined whether the current program loop number is smaller than a threshold loop number (S650). When the current program loop number is smaller than the threshold loop number, the magnitude of a program pulse value is increased to increase threshold voltages of memory cells that have not been completely programmed (S660), and a subsequent program loop is performed by proceeding to the step S610.

When the program loop number reaches the threshold loop number as the determination result of the step S650, a dummy program pulse is applied to the memory cells 402 to program all the memory cells in the selected physical page 400 (S670). The dummy program pulse of the step S670 may be the maximum program pulse Vpgm_max shown in FIG. 18. Subsequently, data representing program fail is stored in the status storage 101 or 140 (S680). Subsequently, the program operation is ended. Therefore, a final program operation fails.

Although it is determined, at the step S630, that the program verification failed, data stored in the memory cells 402 are data to be recovered by an operation such as ECC in a previous program loop, the data stored in the memory cells are destroyed and may not be recovered by ECC when the step S670 is performed. Accordingly, after SPO occurs, the controller 200 may clearly determine, through a read operation with ECC, that a previous program operation failed.

In a usual case where SPO does not occur, the controller 200 transfers a status read request SRR to the semiconductor memory device 100. Subsequently, it may be determined whether target memory cells have been verified as properly programmed, based on status read data SRD received from the semiconductor memory device 100.

When the SPO occurs, the controller 200 may generate a read command for a physical page 400 on which a just previous program operation was being performed, and transfer the read command to the semiconductor memory device 100. The controller 200 determines whether the read operation has passed by receiving read data corresponding to the read command from the semiconductor memory device 100.

When the read operation is successful (no error or errors can be corrected by ECC), it may be determined that the status of a program operation before the SPO was "program pass." When the read operation fails (errors exceed the ECC capability), the step S670 is performed, and therefore, it may be determined that the program operation before the SPO failed.

When it is determined that target memory cells have been verified as properly programmed ("program pass") at the step S630, data representing "program pass" is stored in the status storage 101 or 140 (S640), and the program operation is ended.

Figure 24:
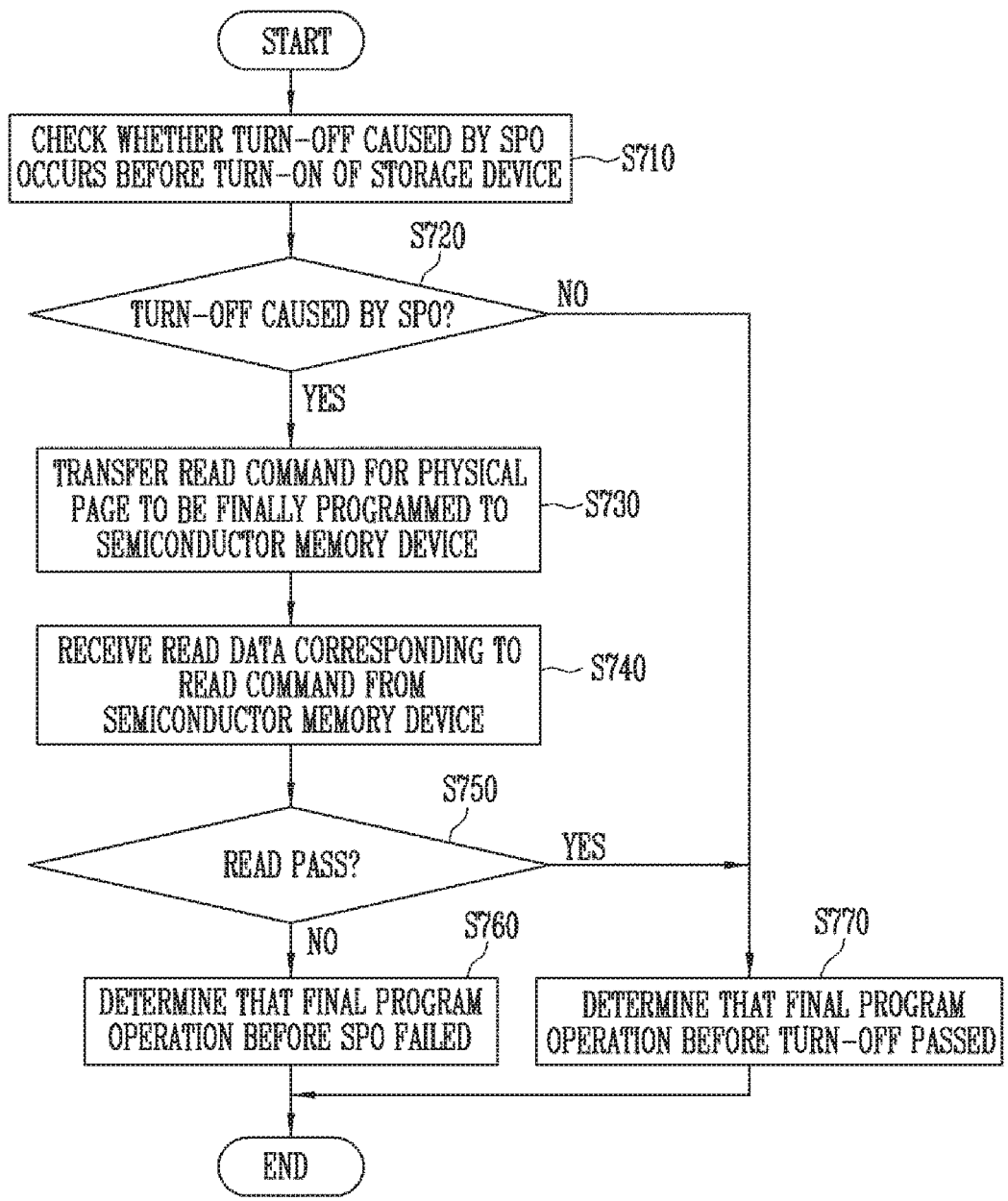
FIG. 24 is a flowchart illustrating an example of an operating method of the controller based on an embodiment of the disclosed technology.

FIG. 24 is a flowchart illustrating an example of an operating method of the controller based on an embodiment of the disclosed technology. In particular, the flowchart shown in FIG. 24 illustrates an operating method of the controller after the storage device 1000 is turned on. Hereinafter, the operating method shown in FIG. 24 will be described with reference to FIG. 13A together.

Referring to FIG. 24, when the storage device 1000 is turned on, the SPO sensor 210 of the controller 200 checks as to whether a turn-off caused by SPO has occurred before the turn-on of the storage device 1000 (S710). Subsequently, in step S720, the program pass determiner 230 determines whether the turn-off just before the turn-on of the storage device 1000 is caused by the SPO.

When the turn-off of the storage device 1000 is not caused by the SPO but is a normal turn off, the program pass determiner 230 may determine that a final program operation before the turn-off was completed without any unexpected interruption (S780). This is because the program operation was completed before the storage device 1000 is normally turned off.

When the turn-off of the storage device is caused by the SPO, a read command for a physical page 400 on which the final program operation was performed before the SPO is transferred to the semiconductor memory device 100 (S730). To this end, the program pass determiner 230 generates a control signal CTRL for reading data of the physical page to be finally programmed, and transfers the control signal CTRL to the command generator 250. The command generator 250 generates a read command RCMD for reading data of the physical page 400 including the flag memory cell and transfers the read command RCMD to the semiconductor memory device 100, based on the control signal CTRL. The semiconductor memory device 100 receiving the read command reads data stored in memory cells of the physical page 400, and transfers the read data to the controller 200. The controller 200 receives the read data from the semiconductor memory device 100 (S740).

The program pass determiner 230 of the controller 200 determines whether read data obtained by a read operation has errors, and, if it has errors, determined whether the errors can be corrected by performing an error correction operation on the received read data (S750). When the errors can be corrected by the error correction operation, the status of the read data RDATA can be indicated by "ECC pass." By contrast, when the errors cannot be corrected by the error correction operation because the amount of errors exceeds the error correction capacity of the error correction operation, the status of the read data can be indicated by "ECC fail." In the case of "ECC pass," it can be seen that the operation of applying the dummy program pulse according to the step S670 shown in FIG. 23 has not been performed. Accordingly, the program pass determiner 230 determines that target memory cells were verified as properly programmed at the final program operation before the SPO (S770). In the case of "ECC fail," it can be seen that the operation of applying the dummy program pulse according to the step S670 shown in FIG. 23 has been performed. Accordingly, the program pass determiner 230 determines that the final program operation before the SPO has failed (S760).

When it is determined that the final program operation before the SPO has failed, the controller 200 may perform a subsequent operation corresponding to the determination result. For example, the command generator 250 may generate a program command for re-performing the program operation that has failed, and transfer the program command to the semiconductor memory device 100. In addition, various operations corresponding to the program fail may be performed.

Figure 25:
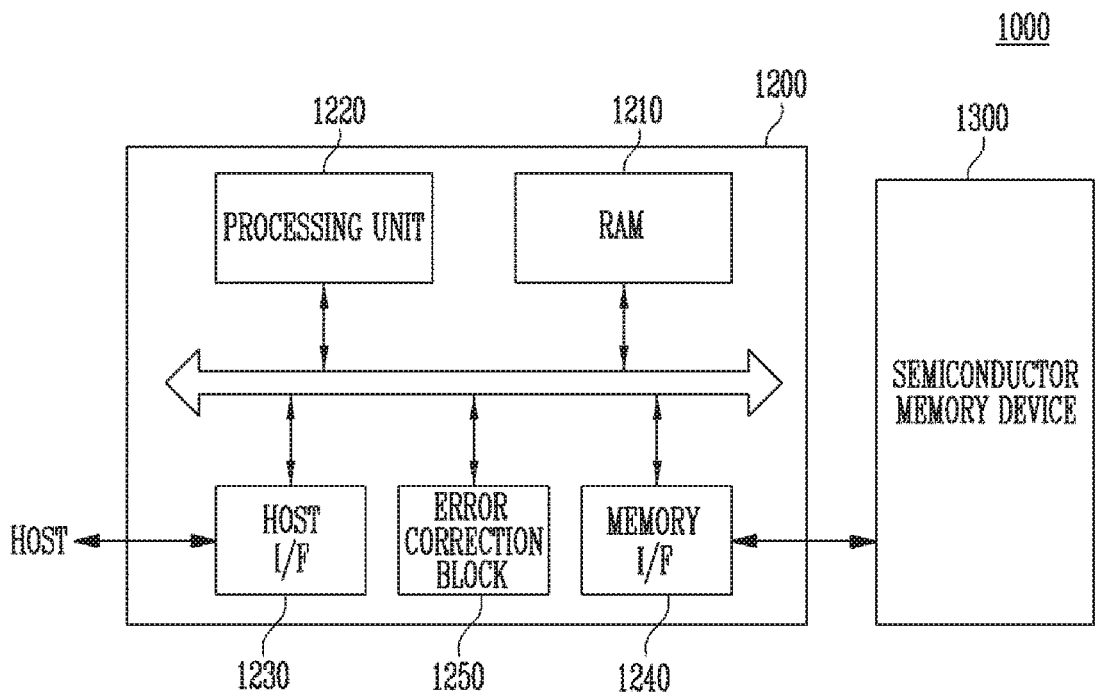
FIG. 25 is a block diagram illustrating an example of a storage device including the semiconductor memory device shown in FIG. 2.

FIG. 25 is a block diagram illustrating an example of a storage device 1000 including the semiconductor memory device shown in FIG. 2.

Referring to FIG. 25, the storage device 1000 includes a semiconductor memory device 1300 and a controller 1200.

The semiconductor memory device 1300 may be configured and operated identically to the semiconductor memory device 100 described with reference to FIG. 2. Hereinafter, overlapping descriptions will be omitted.

The controller 1200 is coupled to a host Host and the semiconductor memory device 1300. The controller 1200 is configured to access the semiconductor memory device 1300 in response to a request from the host Host. For example, the controller 1200 is configured to control read, program, erase, and background operations of the semiconductor memory device 1300. The controller 1200 is configured to provide an interface between the semiconductor memory device 1300 and the host Host. The controller 1200 is configured to drive firmware for controlling the semiconductor memory device 1300.

The controller 1200 includes a random access memory (RAM) 1210, a processing unit 1220, a host interface (I/F) 1230, a memory interface (I/F) 1240, and an error correction block 1250.

The RAM 1210 is used as any one of a working memory of the processing unit 1220, a cache memory between the semiconductor memory device 1300 and the host Host, and a buffer memory between the semiconductor memory device 1300 and the host Host.

The processing unit 1220 controls overall operations of the controller 1200. The processing unit 1220 controls a read, program, erase, and background operations of the semiconductor memory device 1300. The processing unit 1220 drives firmware for controlling the semiconductor memory device 1300. The processing unit 1220 may perform a function of a flash translation layer (FTL). The processing unit 1220 may translate a logical block address (LBA) provided by the host Host through the FTL into a physical block address (PBA). The FTL may receive an LBA, using a mapping table, to be translated into a PBA. Several address mapping methods of the FTL exist according to mapping units. A representative address mapping method includes a page mapping method, a block mapping method, and a hybrid mapping method.

The SPO sensor 210, the program pass determiner 230, and the command generator 250, which are shown in FIG. 13A, may be implemented in the form of software or firmware driven by the processing unit 1220.

The host I/F 1230 includes a protocol for exchanging data between the host Host and the controller 1200. In an exemplary embodiment, the controller 1200 is configured to communicate with the host Host through at least one of various interface protocols such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA protocol, a Parallel-ATA protocol, a Small Computer Small Interface (SCSI) protocol, an Enhanced Small Disk Interface (ESDI) protocol, an Integrated Drive Electronics (IDE) protocol, and a private protocol.

The memory I/F 1240 interfaces with the semiconductor memory device 1300. For example, the memory I/F 1240 may include a NAND interface or a NOR interface.

The error correction block 1250 is configured to detect and correct an error of data received from the semiconductor memory device 1300 by using an error correction code (ECC). The error correction block 1250 may correct an error of read page data, using an ECC. The error correction block 1250 may correct an error, using coded modulation including low density parity check (LDPC) code, Bose, Chaudhuri, and Hocquenghem (BCH) code, turbo code, Reed-Solomon code, convolution code, recursive systematic code (RSC), trellis-coded modulation (TCM), block coded modulation (BCM), Hamming code, etc.

In a read operation, the error correction block 1250 may correct an error of read page data. When error bits of which number exceeds an error correctable bit number are included in the read page data, decoding may fail. When error bits of which number is equal to or smaller than the error correctable bit number are included in the read page data, the decoding may succeed. The success of the decoding represents that a corresponding read command has passed. The failure of the decoding represents that the corresponding read command has failed. When the decoding succeeds, the controller 1200 outputs the page data of which error has been corrected to the host Host.

The controller 1200 and the semiconductor memory device 1300 may be integrated into one semiconductor device. In an exemplary embodiment, the controller 1200 and the semiconductor memory device 1300 may be integrated into one semiconductor device, to constitute a memory card. For example, the controller 1200 and the semiconductor memory device 1300 may be integrated into one semiconductor device, to constitute a memory card such as a PC card (Personal Computer Memory Card International Association (PCMCIA)), a Compact Flash (CF) card, a Smart Media Card (SM or SMC), a memory stick, a Multi-Media Card (MMC, RS-MMC or MMCmicro), an SD Card (SD, miniSD, microSD or SDHC), or a Universal Flash Storage (UFS).

The controller 1200 and the semiconductor memory device 1300 may be integrated into one semiconductor device to constitute a semiconductor drive (solid state drive (SSD)). The semiconductor drive SSD includes a storage device configured to store data in a semiconductor memory. If the storage device 1000 is used as the semiconductor drive SSD, the operating speed of the host Host coupled to the storage device 1000 can be remarkably improved.

As another example, the storage device 1000 may be provided as one of various components of an electronic device such as a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multimedia Player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an exemplary embodiment, the semiconductor memory device 1300 or the storage device 1000 may be packaged in various forms. For example, the semiconductor memory device 1300 or the storage device 1000 may be packaged in a manner such as Package On Package (PoP), Ball Grid Arrays (BGAs), Chip Scale Packages (CSPs), Plastic Leaded Chip Carrier (PLCC), Plastic Dual In-line Package (PDIP), die in Waffle pack, die in wafer form, Chip On Board (COB), CERamic Dual In-line Package (CERDIP), plastic Metric Quad Flat Pack (MQFP), Small Outline Integrated Circuit (SOIC), Shrink Small Outline Package (SSOP), Thin Small Outline Package (TSOP), Thin Quad Flat Pack (TQFP), System In Package (SIP), Multi-Chip Package (MCP), Wafer-level Fabricated Package (WFP), or Wafer-level processed Stack Package (WSP).

Figure 26:
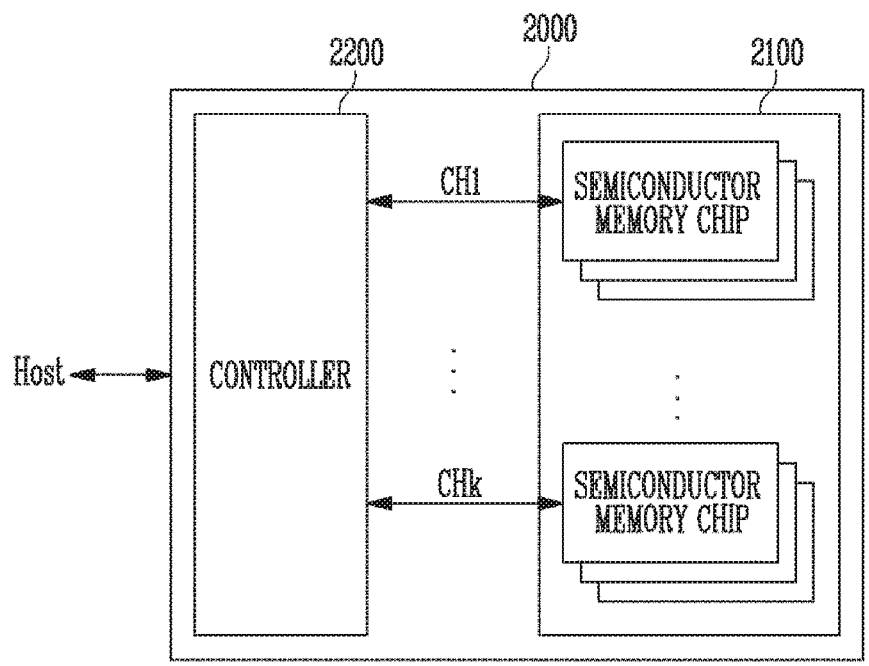
FIG. 26 is a block diagram illustrating an application example of the storage device shown in FIG. 25.

FIG. 26 is a block diagram illustrating an application example 2000 of the storage device shown in FIG. 25.

Referring to FIG. 26, the storage device 2000 includes a semiconductor memory device 2100 and a controller 2200. The semiconductor memory device 2100 includes a plurality of semiconductor memory chips. The plurality of semiconductor memory chips are divided into a plurality of groups.

FIG. 26 illustrates that the plurality of groups communicate with the controller 2200 through first to kth channels CH1 to CHk. Each semiconductor memory chip may be configured and operated identically to the semiconductor memory device 1300 described with reference to FIG. 25.

Each group is configured to communicate with the controller 2200 through one common channel. The controller 2200 is configured identically to the controller 1200 described with reference to FIG. 25. The controller 2200 is configured to control the plurality of semiconductor memory chips of the semiconductor memory device 2100 through the plurality of channels CH1 to CHk.

In FIG. 26, a case where a plurality of semiconductor memory chips are coupled to one channel is described. However, it will be understood that the storage device 2000 may be modified such that one semiconductor memory chip is coupled to one channel.

Figure 27:
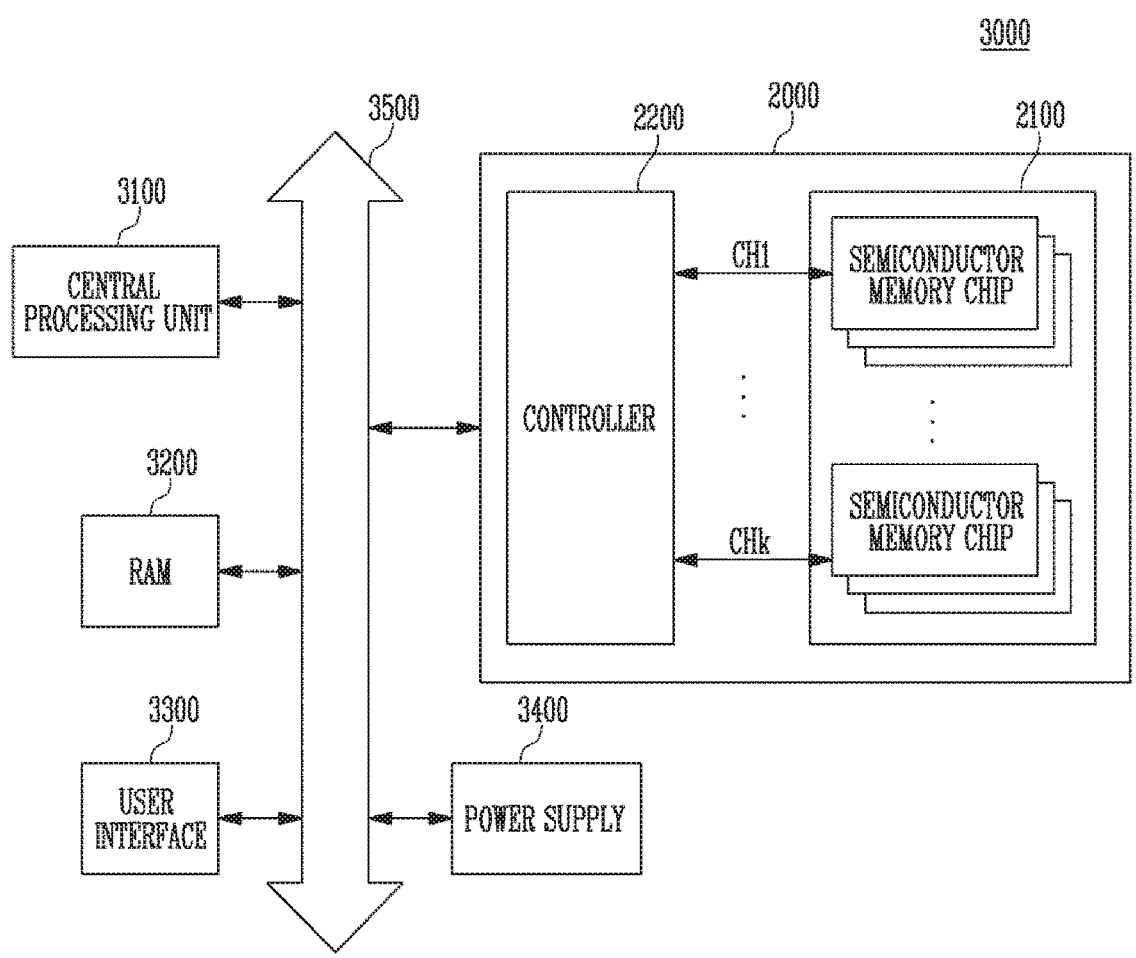
FIG. 27 is a block diagram illustrating a computing system including the storage device described with reference to FIG. 26.

FIG. 27 is a block diagram illustrating a computing system including the storage device described with reference to FIG. 26.

Referring to FIG. 27, the computing system 3000 includes a central processing unit 3100, a RAM 3200, a user interface 3300, a power supply 3400, a system bus 3500, and a storage device 2000.

The storage device 2000 is electrically coupled to the central processing unit 3100, the RAM 3200, the user interface 3300, and the power supply 3400 through the system bus 3500. Data supplied through user interface 3300 or data processed by the central processing unit 3100 are stored in the storage device 2000.

FIG. 27 illustrates that the semiconductor memory device 2100 is coupled to the system bus 3500 through the controller 2200. However, the semiconductor memory device 2100 may be directly coupled to the system bus 3500. The function of the controller 2200 may be performed by the central processing unit 3100 and the RAM 3200.

FIG. 27 illustrates that the storage device 2000 described with reference to FIG. 26 is provided. However, the storage device 2000 may be replaced by the storage device 1000 described with reference to FIG. 25. In an embodiment, the computing system 3000 may be configured to include both of the storage devices 1000 and 2000 described with reference to FIGS. 25 and 26.

In performing program operations on target memory cells, a tight threshold voltage control is typically realized by using a program-and-verify approach with the incremental step pulse programming (ISPP) scheme. In the ISPP scheme, a series of programming pulses of increasing magnitude are applied to selected memory cells to gradually raise the threshold voltage of the memory cells to above a target threshold voltage level. Under the program-and-verify approach, such programming pulses (increasing on a step-voltage basis) are applied to the selected memory cells, and, between each two successive programming pulses, verification read voltages are applied to verify whether the threshold voltage of the selected memory cell was raised to above the target threshold voltage distribution (i.e., whether the selected memory cells were properly programmed). These program and program verification steps are repeated for a predetermined number of iterations or until all target memory cells have been verified as properly programmed within a predetermined number of iterations.

In case the status of the selected memory cell (e.g., whether the selected memory cell is properly programmed such that they are in the target threshold voltage distribution) cannot be determined due to an unexpected event such as a sudden power loss (e.g., SPO) that occurs before the status of the selected memory cell is notified to a memory controller (e.g., host side controller, memory storage controller, flash translation layer, etc.), the selected memory cell might be considered as a properly programmed memory cell regardless of the status of the selected memory cell if an error correction engine is able to correct errors in the data read out from the selected memory cell. For example, memory cells that should have been treated as not properly programmed can be mistaken as properly programmed memory cells if data read out from the memory cells are correctable by an error correction engine. Those memory cells can have a relatively short data retention time compared to other memory cells that have been verified as properly programmed. The controller, however, is unaware of those "unverified" memory cells.

In some embodiments of the disclosed technology, the memory array can include one or more flag cells to store its status—whether a program verification process for the selected memory cell has been interrupted, causing the selected memory cell to be in such "unverified" state, and the controller can refer to flag cells to see the status of the selected memory cell. The flag memory cells can be programmed by using one or more ISPP programming pulses that are applied to regular memory cells or by using additional programming pulse outside the ISPP programming pulses.

In an embodiment of the disclosed technology, A semiconductor memory device includes a memory cell array and a controller. The memory cell array includes a plurality of memory cells and one or more flag cells, and each flag cell is coupled to a unit of memory cells via a word line. The controller is in communication with the memory cell array and configured to: select, from word lines coupled to the plurality of memory cells, a word line coupled to target memory cells for programming; apply, to the selected word line, a series of programming pulses of increasing magnitude to be used to raise the threshold voltage of the target memory cells and program verification pulses to be used to verify whether the threshold voltage of the target memory cells has been raised to above a target threshold voltage level; apply control voltages to place the target memory cells in condition for application of programming pulses and application of program verification pulses to gradually raise the threshold voltage of the target memory cells while performing a program verification whether the threshold voltage of the target memory cells has been raised to above the target threshold voltage level; and, upon determination on a status of the program verification, apply control voltages to place the one or more flag cells in condition for application of programming pulse to program the one or more flag cells to indicate the status of the program verification.

As an example, the determination on the status of the program verification includes a verification that the threshold voltage of the target memory cells has been raised to above the target threshold voltage level. As another example, the controller is further configured to, during a read operation after a sudden power loss, treat data read out from the target memory cells as erroneous data. As another example, the controller is further configured to, during a read operation after a sudden power loss, copy data read out from the target memory cells to other memory cells, upon successful read of the data by an error correction engine. As another example, the determination on the status of the program verification includes a verification that the threshold voltage of the target memory cells has failed to reach the target threshold voltage level. Here, the controller is further configured to, during a read operation after a sudden power loss, treat data read out from the target memory cells as erroneous data upon determination that the one or more flag cells are programmed. The controller is also configured to, upon determination that the one or more flag cells are programmed, treat the target memory cells as failed memory cells.

In an implementation, the one or more flag cells are programmed using at least one of the series of programming pulses. In another implementation, the one or more flag cells are programmed using one or more programming pulses applied in addition to the series of programming pulses.

In an embodiment of the disclosed technology, a semiconductor memory device includes a memory cell array and a controller. The memory cell array includes a plurality of memory cells to store data and one or more flag cells to indicate a status of program operations on the plurality of memory cells. The controller is in communication with the memory cell array and configured to: determine whether the one or more flag cells associated with the plurality of memory cells are programmed; read the plurality of memory cells to determine whether data is successfully read by an error correction engine; and determine whether the plurality of memory cells have been properly programmed and whether to treat the plurality of memory cells as failed memory cells based on the determination as to whether the one or more flag cells are programmed and the determination as to whether the data is successfully read by the error correction engine.

Some embodiments of the disclosed technology can determine whether to treat data stored in the target memory cells as erroneous data and/or whether to treat the target memory cells as failed memory cells based on whether the flag cell is programmed and whether the errors of the data read out from the target memory cells can be corrected by the error correction engine.

In an implementation, the controller may, upon determination that the plurality of memory cells has been verified as properly programmed and that the data is successfully read by the error correction engine, treat data read out from the plurality of memory cells as valid data.

In another implementation, the controller may, upon determination that the plurality of memory cells has not been verified as properly programmed and that the data is successfully read by the error correction engine, treat data read out from the plurality of memory cells as erroneous data.

In another implementation, the controller may, upon determination that the plurality of memory cells has not been verified as properly programmed and that the data is successfully read by the error correction engine, treat the plurality of memory cells as failed memory cells.

In another implementation, the controller may, upon determination that the plurality of memory cells has been verified as properly programmed and that the data is not successfully read by the error correction engine, treat data read out from the plurality of memory cells as erroneous data.

In another implementation, the controller may, upon determination that the plurality of memory cells has not been verified as properly programmed and that the data is not successfully read by the error correction engine, treat data read out from the plurality of memory cells as erroneous data.

In another implementation, the controller may, upon determination that the plurality of memory cells has not been verified as properly programmed and that the data is not successfully read by the error correction engine, treat the plurality of memory cells as failed memory cells.

In some embodiments of the disclosed technology, the programmed flag cells include a first flag cell to indicate the plurality of memory cells have been verified as properly programmed and a second flag cell to indicate the plurality of memory cells have not been verified as properly programmed.

In an implementation, upon determination that both the first and second flag cells are programmed, treat the plurality of memory cells as failed memory cells.

In another implementation, upon determination that both the first and second flag cells are not programmed and that the data is not successfully read by the error correction engine, treat data read out from the plurality of memory cells as erroneous data.

In another implementation, upon determination that both the first and second flag cells are not programmed and that the data is successfully read by the error correction engine, copy data read out from the plurality of memory cells to other memory cells.

In some embodiments of the disclosed technology, the method performed by the controller as discussed above can be performed when the semiconductor memory device is powered on after a sudden power loss.

In some embodiments of the disclosed technology, there can be provided a semiconductor memory device having improved reliability, a controller, and an operating method thereof.

While the disclosed technology has been shown and described with reference to certain exemplary embodiments thereof, it will be understood by those skilled in the art that various changes in form and details may be made therein without departing from the spirit and scope of the disclosed technology as defined by the appended claims and their equivalents. Therefore, the scope of the disclosed technology should not be limited to the above-described exemplary embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the disclosed technology, and the disclosed technology is not limited thereto. That is, it should be apparent to those skilled in the art that various modifications can be made on the basis of the technological scope of the disclosed technology.

Meanwhile, the exemplary embodiments of the disclosed technology have been described in the drawings and specification. Although specific terminologies are used here, those are only to explain the embodiments of the disclosed technology. Therefore, the disclosed technology is not restricted to the above-described embodiments and many variations are possible within the spirit and scope of the disclosed technology. It should be apparent to those skilled in the art that various modifications can be made on the basis of the technological scope of the disclosed technology in addition to the embodiments disclosed herein.

What is claimed is:

1. A semiconductor memory device comprising:
a memory cell array including a plurality of memory cells and one or more flag cells, each flag cell coupled to a unit of memory cells via a word line;
a controller in communication with the memory cell array and configured to:
select, from word lines coupled to the plurality of memory cells, a word line coupled to a set of target memory cells from the plurality of memory cells for programming;
apply, to the selected word line, a series of programming pulses of increasing magnitude to raise threshold voltages of the set of target memory cells and program verification pulses to verify whether the threshold voltages of the set of target memory cells have been raised to above target threshold voltage levels;
apply the series of programming pulses to the set of target memory cells; and
upon determination that program operations on the set of target memory cells have not been verified as properly programmed after performing program and program verification operations for a predetermined number of iterations, apply one or more additional programming pulses for programming the one or more flag cells to indicate the program operations on the set of target memory cells have finally failed.

2. The semiconductor memory device of claim 1, wherein the controller is further configured to, during a read operation of the semiconductor memory device that is turned on after a power loss, copy data read out from the set of target memory cells to memory cells different from the set of target memory cells, upon successful read of the data by an error correction engine.

3. The semiconductor memory device of claim 1, wherein the controller is further configured to, during a read operation of the semiconductor memory device turned on after a power loss, process data read out from the set of target memory cells as erroneous data upon a determination that the one or more flag cells are programmed.

4. The semiconductor memory device of claim 1, wherein the controller is further configured to, upon a determination that the one or more flag cells are programmed, designate the set of target memory cells as failed memory cells.

5. The semiconductor memory device of claim 1, wherein the one or more additional programming pulses are applied after the predetermined number of iterations.

6. The semiconductor memory device of claim 1, wherein the controller is further configured to:
read data successfully from the plurality of memory cells by an error correction engine; and
determine that the data successfully read by the error correction engine is erroneous, upon determination that the one or more flag cells associated with the plurality of memory cells are programmed by the one or more additional programming pulses.

7. The semiconductor memory device of claim 6, wherein the controller is further configured to:
upon determination that the one or more flag cells associated with the plurality of memory cells are programmed by the one or more additional programming pulses, perform a reprogramming operation on the plurality of memory cells.

8. A semiconductor memory device comprising:
a memory cell array including a plurality of memory cells to store data and one or more flag cells to indicate whether program operations on the plurality of memory cells have finally failed after performing program and program verification operations for a predetermined number of iterations;
a controller in communication with the memory cell array and configured to:
determine whether the one or more flag cells are programmed to indicate the program operations on the plurality of memory cells associated with the one or more flag cells have finally failed;
read data successfully from the plurality of memory cells by an error correction engine; and
determine that the data successfully read by the error correction engine is erroneous, upon determination that the one or more flag cells associated with the plurality of memory cells are programmed.

9. The semiconductor memory device of claim 8, wherein the controller is further configured to, upon a determination that the program operations on the plurality of memory cells have been verified as completed and that the data is successfully read by the error correction engine, process data read out from the plurality of memory cells as valid data.

10. The semiconductor memory device of claim 8, wherein the controller is further configured to, upon a determination that the one or more flag cells associated with the plurality of memory cells are programmed to indicate the program operations on the plurality of memory cells have not been verified as completed and that the data is successfully read by the error correction engine, process data read out from the plurality of memory cells as erroneous data.

11. The semiconductor memory device of claim 8, wherein the controller is further configured to, upon a determination that the one or more flag cells associated with the plurality of memory cells are programmed to indicate the program operations on the plurality of memory cells have not been verified as completed and that the data is successfully read by the error correction engine, designate the plurality of memory cells as failed memory cells.

12. The semiconductor memory device of claim 8, wherein the controller is further configured to, upon a determination that the program operations on the plurality of memory cells have been verified as completed and that the data is not successfully read by the error correction engine, process data read out from the plurality of memory cells as erroneous data.

13. The semiconductor memory device of claim 8, wherein the controller is further configured to, upon a determination that the one or more flag cells associated with the plurality of memory cells are programmed to indicate the program operations on the plurality of memory cells have not been verified as completed and that the data is not successfully read by the error correction engine, process data read out from the plurality of memory cells as erroneous data.

14. The semiconductor memory device of claim 8, wherein the controller is further configured to, upon a determination that the one or more flag cells associated with the plurality of memory cells are programmed to indicate the program operations on the plurality of memory cells have not been verified as completed and that the data is not successfully read by the error correction engine, designate the plurality of memory cells as failed memory cells.

15. The semiconductor memory device of claim 8, wherein the memory cell array further includes an additional flag cell to indicate the program operations on the plurality of memory cells have been verified as completed.

16. The semiconductor memory device of claim 15, wherein, upon a determination that both the flag cells and the additional flag cells are not programmed and that the data is not successfully read by the error correction engine, process data read out from the plurality of memory cells as erroneous data.

17. The semiconductor memory device of claim 15, wherein, upon a determination that both the flag cells and the additional flag cells are not programmed and that the data is successfully read by the error correction engine, copy data read out from the plurality of memory cells to memory cells different from the set of target memory cells.

* * * * *